(12) United States Patent
Dabadie et al.

(10) Patent No.: US 10,718,046 B2
(45) Date of Patent: Jul. 21, 2020

(54) HIGH-BARRIER, METAL OXIDE FILMS

(71) Applicant: Jindal Films Americas LLC, LaGrange, GA (US)

(72) Inventors: Thierry J. L. Dabadie, Luxembourg (LU); Massimo Pignatelli, Cadiz (ES); François Gastineau, Letzebuerg (LU); Gabriel Domingos, Allondrelle-la-Malmaison (FR)

(73) Assignee: Jindal Films Americas LLC, LaGrange, GA (US)

( * ) Notice: Subject to any disclaimer, the term of this patent is extended or adjusted under 35 U.S.C. 154(b) by 0 days.

(21) Appl. No.: 16/409,931

(22) Filed: May 13, 2019

(65) Prior Publication Data

US 2019/0270288 A1 Sep. 5, 2019

Related U.S. Application Data

(63) Continuation of application No. PCT/US2017/065648, filed on Dec. 11, 2017.
(Continued)

(51) Int. Cl.
*C23C 14/00* (2006.01)
*B32B 27/08* (2006.01)
(Continued)

(52) U.S. Cl.
CPC .......... *C23C 14/0021* (2013.01); *B32B 27/08* (2013.01); *B32B 27/18* (2013.01);
(Continued)

(58) Field of Classification Search
CPC ......... B32B 27/08; B32B 27/18; B32B 27/32; B32B 27/36; B32B 27/40; B32B 37/153
(Continued)

(56) References Cited

U.S. PATENT DOCUMENTS 4,078,935 A 3/1978 Nakagiri et al.
9,284,104 B2 3/2016 Godfroid et al.
(Continued)

FOREIGN PATENT DOCUMENTS

WO 2013141918 A1 9/2013
WO WO-2013141918 A1 * 9/2013 ........... C23C 14/081

OTHER PUBLICATIONS

Shane Thomas, WO/ISR, Feb. 22, 2018, USPTO, Alexandria, VA, US.
(Continued)

*Primary Examiner* — Catherine A. Simone
(74) *Attorney, Agent, or Firm* — Rao DeBoer Osterrieder, PLLC; Erik J. Osterrieder

(57) ABSTRACT

This disclosure provides compositions and methods for a film, which may include a base film and a coating layer on the base film, wherein the coating layer has a surface energy of at least 30 dynes/cm and consists essentially of nylon, polyester, ethylene vinyl alcohol-based copolymer, polyvinyl alcohol-based polyethylene terephthalate, polyvinylchloride, acrylate-based polymers, methacrylate-based polymers, polyurethane, polyalkylimine, acid-modified polyolefins, polyetherester-amide block copolymer, and combinations thereof. Further, the film may include a metal oxide layer on the coating layer, wherein the metal oxide layer has an optical density of equal to or less than 0.5 and a thickness from 0.1 nm through 100 nm. Further still, the film has an oxygen transmission rate of less than 4 $cm^3/m^2/$day at 23° C. and 0% relative humidity, a water vapor transmission rate of less than 4 $g/m^2/$day at 38° C. and 90% relative humidity, and a thickness of 5 μm through 50 μm.

16 Claims, 19 Drawing Sheets

Related U.S. Application Data

(60) Provisional application No. 62/469,967, filed on Mar. 10, 2017, provisional application No. 62/432,284, filed on Dec. 9, 2016.

(51) Int. Cl.
| | |
|---|---|
| *B32B 37/15* | (2006.01) |
| *B32B 27/18* | (2006.01) |
| *B32B 27/32* | (2006.01) |
| *B32B 27/40* | (2006.01) |
| *B32B 27/36* | (2006.01) |
| *C23C 14/08* | (2006.01) |
| *C23C 14/24* | (2006.01) |
| *C23C 14/02* | (2006.01) |
| *C23C 14/56* | (2006.01) |
| *C23C 14/58* | (2006.01) |

(52) U.S. Cl.
CPC .............. *B32B 27/32* (2013.01); *B32B 27/36* (2013.01); *B32B 27/40* (2013.01); *B32B 37/153* (2013.01); *C23C 14/022* (2013.01); *C23C 14/024* (2013.01); *C23C 14/081* (2013.01); *C23C 14/24* (2013.01); *C23C 14/562* (2013.01); *C23C 14/5826* (2013.01); *B32B 2255/10* (2013.01); *B32B 2255/26* (2013.01)

(58) Field of Classification Search
USPC ........................................................ 428/461
See application file for complete search history.

(56) References Cited

U.S. PATENT DOCUMENTS

| | | |
|---|---|---|
| 2009/0176103 A1 | 7/2009 | Arai et al. |
| 2011/0195259 A1 | 8/2011 | Song |
| 2014/0199505 A1 | 7/2014 | Lorenzetti et al. |

OTHER PUBLICATIONS

Erik Osterrieder, Demand, Jul. 6, 2018, Houston, TX, US.
Charles Garber, IPER, Dec. 14, 2018, USPTO, Alexandria, VA, US.
Anonymous, Third-Party Observations, Apr. 8, 2019.

* cited by examiner

| Sample Description Coating | WVTR (g/m²/Day) @ 38°C/90% RH | | | | OTR (cc/m²/Day) @ 23°C/0% RH | | | |
|---|---|---|---|---|---|---|---|---|
| | Flexography Offset | Direct Gravure | Reverse Gravure | No | Flexography Offset | Direct Gravure | Reverse Gravure | No |
| BOPP AlOx Design# 1 | | | | | | | | |
| EAA Formulated(*) | 2,4 | | | | 0,5 | | | |
| PU#1 | 2,7 | | | | 0,4 | | | |
| PVOH | 2,4 | 3,0 | | | 0,4 | 0,1 | | |
| PU#2 (**) | 1,5 | | | | 1,3 | | | |
| No | | | | 1,2 | | | | 0,6 |
| BOPP AlOx Design# 2 | | | | | | | | |
| EAA Formulated(*) | 3,1 | | | | | 200 | | |
| PU#1 | 3,4 | 4,7 | 3,8 | | | 200 | | |
| PVOH | 1,1 | | | | | 3,4 | 21,3 | 2,3 |
| PU#2 (**) | 3,0 | | | | | 200 | | |
| No | | | | 1,2 | | | | 137 |

*: Optionally with wax(es) and particles

**: Anionic aliphatic dispersion

FIGURE 4

| Sample Description Coating Process | WVTR (g/m²/Day) @ 38°C/90% RH | | OTR (cc/m²/Day) @ 23°C/0% RH | |
|---|---|---|---|---|
| | Under mechanical constraints | No mechanical constraints | Under mechanical constraints | No mechanical constraints |
| BOPP AlOx Design# 1 w. PU#2 applied with Flexography/Offset | | | | |
| After 2% elongation | X | | X | |
| After 20 Gelbo flexes | X | | X | |
| No | | 1.5 | | 1.3 |
| BOPP AlOx Design# 2 w. PVOH applied with Flexography/Offset | | | | |
| After 2% elongation | X | | X | |
| After 20 Gelbo flexes | X | | X | |
| No | | 1.1 | | 3.4 |

Examples of Oxygen Transmission Rates (cm$^3$/m$^2$/day @ 23°C and 0% RH) for AlO$_x$ Coextruded EVOH BOPP films

| Sample | Unslit | | | | | | Slit | | | |
|---|---|---|---|---|---|---|---|---|---|---|
| | 1 | 2 | 3 | 4 | 5 | 6 | 7 | 8 | 9 | 10 |
| Treatment: Measurement (roll number) | Pre Ar 80% Post O$_2$ 20% | None | Pre only | Post only | Pre & Post | Pre Ar 80% Post O$_2$ 20% | None | Pre only | Post only | Pre & Post |
| OTR 0% RH (West) (1) | 3.3 | 2.0 | 1.2 | 5.3 | 1.7 | 1.2 | 2.6 | 1.0 | 2.2 | 1.4 |
| OTR 0% RH (West) (2) | 1.5 | 2.2 | 0.9 | 2.1 | 1.9 | 0.9 | 3.1 | 1.8 | 2.7 | 1.1 |
| OTR 0% RH (Center) (1) | 1.4 | 2.5 | 2.6 | 4.5 | 1.7 | 1.7 | 2.3 | 1.7 | 3.2 | 1.7 |
| OTR 0% RH (Center) (2) | 1.4 | 2.4 | 2.7 | 3.3 | 1.6 | 1.6 | 2.3 | 1.1 | 3.0 | 1.9 |
| OTR 0% RH (East) (1) | 1.6 | 1.6 | 1.6 | 2.1 | 2.1 | 2.6 | 1.9 | 1.2 | 2.3 | 1.4 |
| OTR 0% RH (East) (2) | 1.5 | 1.4 | 1.5 | 2.1 | 1.9 | 1.5 | 1.7 | 1.0 | 2.1 | 1.2 |
| OTR 70% RH (West) (1) | - | - | - | - | - | - | - | 0.4 | 1.2 | - |
| OTR 70% RH (West) (2) | - | - | - | - | - | - | - | 0.5 | 0.9 | - |
| OTR 70% RH (Center) (1) | 3.1 | 1.9 | 1.0 | 1.0 | 0.8 | 1.4 | 1.5 | 1.6 | 1.7 | 0.8 |
| OTR 70% RH (Center) (2) | 2.0 | 2.5 | 1.0 | 1.2 | 0.9 | 1.4 | 1.3 | 1.5 | 1.8 | 0.5 |
| OTR 70% RH (East) (1) | - | 1.7 | - | - | - | 0.8 | - | - | - | 1.0 |
| OTR 70% RH (East) (2) | - | 2.1 | - | - | - | 0.7 | - | - | - | 1.2 |
| OTR 50% RH (Center) (1) | - | - | 0.9 | 1.2 | 1.0 | 0.4 | 1.2 | 0.6 | 1.6 | 0.9 |
| OTR 50% RH (Center) (2) | - | - | 0.8 | 1.1 | 1.0 | 0.8 | 1.0 | 0.6 | 2.0 | 1.0 |

(1): Replicate# 1
(2): Replicate# 2

FIGURE 7

Examples of Water Vapor Transmission Rates (g/m²/day @ 38°C and 90% RH) for AlOₓ Coextruded EVOH BOPP film

| Sample | 1 | 2 | 3 | 4 | 5 | 6 | 7 | 8 | 9 | 10 |
|---|---|---|---|---|---|---|---|---|---|---|
| | | | Unslit | | | | | | Slit | |
| Treatment: Measurement (roll number) | Pre Ar 80% Post O₂ 20% | None | Pre only | Post only | Pre & Post | Pre Ar 80% Post O₂ 20% | None | Pre only | Post only | Pre & Post |
| WVTR 100% RH (West) (3) | - | - | - | - | - | - | - | - | 5.88 | - |
| WVTR 100% RH (West) (4) | - | - | - | - | - | - | - | - | 5.4 | - |
| WVTR 100% RH (Center) (1) | 0.9 | 1.7 | 2.3 | 2.2 | 1.6 | 1.3 | 1.4 | 1.1 | 2.4 | 1.6 |
| WVTR 100% RH (Center) (2) | 0.9 | 1.7 | 2.8 | 1.8 | 1.1 | 1.4 | 1.7 | 1.0 | 2.4 | 1.6 |
| WVTR 100% RH (East) (1) | 1.0 | 2.0 | 2.8 | 1.3 | 1.8 | 0.9 | 0.8 | 1.0 | 1.5 | 1.0 |
| WVTR 100% RH (East) (2) | 1.4 | 1.9 | 2.2 | 1.6 | 1.4 | 0.8 | 0.8 | 0.7 | 2.0 | 1.1 |
| WVTR 90% RH (West) (1) | - | - | - | - | - | - | 1.3 | - | - | - |
| WVTR 90% RH (West) (2) | - | - | - | - | - | - | 1.3 | - | - | - |
| WVTR 90% RH (Center) (1) | - | - | - | - | - | - | 1.5 | - | - | - |
| WVTR 90% RH (Center) (2) | - | - | - | - | - | - | 1.4 | - | - | - |
| WVTR 90% RH (East) (1) | - | 1.5 | - | - | - | - | 1.2 | - | - | - |
| WVTR 90% RH (East) (2) | - | 2.0 | - | - | - | - | 1.2 | - | - | - |
| WVTR 100% RH average | 1.1 | 1.6 | 1.9 | 1.5 | 1.2 | 1.1 | 1.15 | 0.9 | 3.7 | 1.2 |
| 1 sigma | 0.2 | 0.4 | 0.7 | 0.5 | 0.35 | 0.24 | 0.3 | 0.15 | 1.8 | 0.3 |
| WVTR 90% RH average | - | 1.7 | - | - | - | - | 1.3 | - | - | - |
| 1 sigma | - | 0.4 | - | - | - | - | 0.1 | - | - | - |

(3): Replicate# 3
(4): Replicate# 4

FIGURE 8 Extension Durability Tests for AlOₓ Coextruded EVOH BOPP film

| Area of film | Adhesive Lamination | | Extrusion Lamination | | Adhesive Lamination 2% Extension | | Extrusion Lamination 2% Extension | | Adhesive Lamination 8% Extension | | Extrusion Lamination 8% Extension | |
|---|---|---|---|---|---|---|---|---|---|---|---|---|
| | OTR (cc/m²) | WVTR (g/m²) | OTR (cc/m²) | WVTR (g/m²) | OTR (cc/m²) | WVTR (g/m²) | OTR, (cc/m²) | WVTR (g/m²) | OTR (cc/m²) | WVTR, (g/m²) | OTR (cc/m²) | WVTR, g/m² |
| West | 2.9 | 1.1 | 4.0 | 1.0 | 14 | 2.1 | 6 | 1.0 | 66 | 2.8 | 84 | - |
| Center | 2.9 | 1.0 | 4.0 | 1.1 | 18 | 1.8 | 5 | 1.0 | 66 | 2.7 | 91 | - |
| East | 3.0 | 1.1 | 4.0 | 0.9 | 11 | 2.3 | 8 | 1.0 | 67 | 2.8 | 78 | - |

FIGURE 9 Hayssen and Gelbo Durability Tests for AlOx Coextruded EVOH BOPP film

| Area of film | Adhesive lam Post Hayssen | | Extrusion lam Post Hayssen | | Adhesive lam Gelbo 10 Flex | | Extrusion lam Gelbo 10 Flex | | Adhesive lam Gelbo 20 Flex | |
|---|---|---|---|---|---|---|---|---|---|---|
| | OTR (cc/m²) | WVTR (g/m²) | OTR (cc/m²) | WVTR (g/m²) | OTR (cc/m²) | WVTR (g/m²) | OTR (cc/m²) | WVTR (g/m²) | OTR (cc/m²) | WVTR (g/m²) |
| West | 2.6 | 0.9 | 5 | 1.1 | 11 | 1.2 | 24 | 1.3 | 12 | 1.4 |
| Center | 2.7 | 0.9 | 6 | 1.1 | 10 | 1.1 | 20 | 1.4 | 15 | 1.4 |
| East | 2.5 | 0.9 | 5 | 1.1 | 10 | 1.2 | 28 | 1.2 | 10 | 1.4 |

FIGURE 10    $AlO_x$ deposition process parameters for a 18-micron thick coextruded EVOH-coated BOPP:

| 18 micron Coextruded-EVOH with AlOx variable # | 1 | 2 | 3 | 4 | 5 | 6 | 7 | 8 | 9 | 10 | 11 |
|---|---|---|---|---|---|---|---|---|---|---|---|
| Line/Winding speed (m/min.) | 360 | 360 | 360 | 360 | 360 | 360 | 360 | 360 | 360 | 360 | 360 |
| Al Wire Feeding Speed (mm/min.) | 200 | 200 | 200 | 200 | 200 | 200 | 200 | 200 | 200 | 200 | 200 |
| Coating Drum Temperature (°C) | -3 | -3 | -3 | -3 | -3 | -3 | -3 | -3 | -3 | -3 | -3 |
| Pretreatment plasma Gas Flow (m³/min.) | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ |
| Pretreatment Flow Argon (m³/min.) | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ |
| Pretreatment Flow Nitrogen (m³/min.) | 0 | 0 | 0 | 0 | 0 | 0 | 0 | 0 | 0 | 0 | 0 |
| Pretreatment Flow Oxygen (m³/min.) | 0 | 0 | 0 | 0 | 0 | 0 | 0 | 0 | 500 | 0 | 0 |
| Pretreatment Power (KW) for 2.45 m width | 30 | 30 | 30 | 30 | 30 | 30 | 10 | 20 | 30 | 30 | 30 |
| Evaporation Plasma Gas Flow (m³/min.) | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| Evaporation Plasma Flow Argon (m³/min.) | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| Evaporation Plasma Flow Nitrogen (m³/min.) | 0 | 0 | 0 | 0 | 0 | 0 | 0 | 0 | 0 | 0 | 0 |
| Evaporation Plasma Flow Oxygen (m³/min.) | 0 | 0 | 0 | 0 | 0 | 0 | 0 | 0 | 0 | 0 | 0 |
| Evaporation Plasma Power (KW) | 10 | 10 | 10 | 10 | 10 | 10 | 10 | 10 | 10 | 10 | 10 |
| Oxygen feeding (m³/min.) | $5,9 \times 10^{-4}$ | $6,5 \times 10^{-4}$ | $7,55 \times 10^{-4}$ | $8,25 \times 10^{-4}$ | $8,8 \times 10^{-4}$ | $9,7 \times 10^{-4}$ | $7,8 \times 10^{-4}$ | $7,8 \times 10^{-4}$ | $7,8 \times 10^{-4}$ | $7,8 \times 10^{-4}$ | $7,8 \times 10^{-4}$ |
| Post treatment Gas Flow (m³/min.) | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| Post treatment Flow Argon (m³/min.) | 0 | 0 | 0 | 0 | 0 | 0 | 0 | 0 | 0 | 0 | 0 |
| Post treatment Flow Nitrogen (m³/min.) | 0 | 0 | 0 | 0 | 0 | 0 | 0 | 0 | 0 | 0 | 0 |
| Post treatment Flow Oxygen (m³/min.) | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| Post treatment Power (KW) | 0 | 0 | 0 | 0 | 0 | 0 | 0 | 0 | 0 | 0 | 0 |
| in line AlOx Optical Density | 0.12 | 0.10 | 0.08 | 0.06 | 0.04 | 0.02 | 0.08 | 0.08 | 0.08 | 0.08 | 0.08 |
| WVTR @ 38°C/90%RH Before Slitting (g/m²/Day) | 1.16 | 2.53 | 2.67 | 2.68 | 3.31 | 3.82 | 1.88 | 3.21 | 1.78 | 3.21 | 2.66 |
| WVTR @ 38°C/90%RH After Slitting (g/m²/Day) | 1.56 | | | | | | 1.73 | | 1.62 | | |
| WVTR @ 38°C/90%RH Slab after 1 month (g/m²/Day) | | | | | | | | | | | 3.48 |
| OTR @ 23°C/0%RH Before Slitting (cc/m²/Day) | 0.59 | 1.55 | 2.45 | 2.04 | 1.64 | 1.91 | 1.72 | 2.94 | 1.07 | 1.56 | 1.3 |
| OTR @ 23°C/0%RH After Slitting (cc/m²/Day) | 2.61 | | | | | | 7.28 | | 2.4 | | |
| OTR @ 23°C/0%RH Slab after 1 month (cc/m²/Day) | | | | | | | | | | | |
| Remark | Roll w. Metal aspect | | | | | | | | | | |

FIGURE 11 AlOx deposition process parameters for a 21-micron thick PVOH-coated BOPP

| 21 micron Coated-PVOH with AlOx variable # | 1 | 2 | 3 | 4 | 5 | 6 | 7 | 8 | 9 | 10 | 11 |
|---|---|---|---|---|---|---|---|---|---|---|---|
| Line/Winding speed (m/min.) | 360 | 360 | 360 | 360 | 360 | 360 | 360 | 360 | 360 | 360 | 360 |
| Al Wire Feeding Speed (mm/min.) | 200 | 200 | 200 | 200 | 200 | 200 | 200 | 200 | 200 | 200 | 200 |
| Coating Drum Temperature (°C) | -3 | -3 | -3 | -3 | -3 | -3 | -3 | -3 | -3 | -3 | -3 |
| Pretreatment Gas Flow (m³/min.) | | | | | | | | | | | |
| Pretreatment Flow Argon (m³/min.) | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ |
| Pretreatment Flow Nitrogen (m³/min.) | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ |
| Pretreatment Flow Oxygen (m³/min.) | 0 | 0 | 0 | 0 | 0 | 0 | 0 | 0 | 500 | 0 | 0 |
| Pretreatment Power (KW) for 2.45 m width | 30 | 30 | 30 | 30 | 0 | 30 | 10 | 20 | 30 | 30 | 30 |
| Evaporation Plasma Gas Flow (m³/min.) | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| Evaporation Plasma Flow Argon (m³/min.) | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| Evaporation Plasma Flow Nitrogen (m³/min.) | 0 | 0 | 0 | 0 | 0 | 0 | 0 | 0 | 0 | 0 | 0 |
| Evaporation Plasma Flow Oxygen (m³/min.) | 0 | 0 | 0 | 0 | 0 | 0 | 0 | 0 | 0 | 0 | 0 |
| Evaporation Plasma Power (KW) | 10 | 10 | 10 | 10 | 10 | 10 | 10 | 10 | 10 | 10 | 10 |
| Oxygen feeding (m³/min.) | $5.9 \times 10^{-4}$ | $6.5 \times 10^{-4}$ | $7.55 \times 10^{-4}$ | $8.25 \times 10^{-4}$ | $8.8 \times 10^{-4}$ | $9.7 \times 10^{-4}$ | $7.8 \times 10^{-4}$ | $7.8 \times 10^{-4}$ | $7.8 \times 10^{-4}$ | $7.8 \times 10^{-4}$ | $7.8 \times 10^{-4}$ |
| Post treatment Gas Flow (m³/min.) | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| Post treatment Flow Argon (m³/min.) | 0 | 0 | 0 | 0 | 0 | 0 | 0 | 0 | 0 | 0 | 0 |
| Post treatment Flow Nitrogen (m³/min.) | 0 | 0 | 0 | 0 | 0 | 0 | 0 | 0 | 0 | 0 | 0 |
| Post treatment Flow Oxygen (m³/min.) | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| Post treatment Power (KW) | 0 | 0 | 0 | 0 | 0 | 0 | 0 | 0 | 0 | 0 | 0 |
| In line AlOx Optical Density | 0.12 Metal aspect | 0.10 | 0.08 | 0.06 | 0.04 | 0.02 | 0.08 | 0.08 | 0.08 | 0.08 | 0.08 |
| WVTR @ 38°C/90%RH Before Slitting (g/m²/Day) | 0.50 | 0.91 | 0.86 | 0.57 | 1.02 | 4.00 | 0.85 | 0.88 | 0.83 | 0.79 | 0.44 |
| WVTR @ 38°C/90%RH After Slitting (g/m²/Day) | 0.82 | | | 1.54 | | | | | | | 0.88 |
| WVTR @ 38°C/90%RH Slab after 1 month (g/m²/Day) | | | | | | | | | | | 1.65 |
| OTR @ 23°C/0%RH Before Slitting (cc/m²/Day) | 0.07 | 0.05 | 0.06 | 3.41 | 0.07 | 0.08 | 3.87 | 0.10 | 0.05 | 0.04 | 0.08 |
| OTR @ 23°C/0%RH After Slitting (cc/m²/Day) | 0.04 | | | 0.27 | | | | | | | 0.03 |
| OTR @ 23°C/0%RH Slab after 1 month (g/m²/Day) | | | | | | | | | | 0.23 | 0.18 |

FIGURE 12 Mechanical resistance and Barrier performance robustness of different films having an AlOx deposited thereon

| Base Film | Base Film + AlOx Initial/No mechanical constraint | Folding (*) | Elongation 2% |
|---|---|---|---|
| 18 micron Coextruded-EVOH | | | |
| WVTR (g/m²/Day) – 38°C/90%RH | 1.9 | 2.1 | 3.8 |
| OTR (cc/m²/Day) – 23°C/0%RH | 5.6 | 8.5 | 44.6 |
| 18 micron Coated-EVOH | | | |
| WVTR (g/m²/Day) – 38°C/90%RH | 3.8 | 4.1 | 4.4 |
| OVTR (cc/m²/Day) – 23°C/0%RH | 0.5 | 0.55 | 0.7 |
| 21 micron Coated-PVOH | | | |
| WVTR (g/m²/Day) – 38°C/90%RH | 1.5 | 1.4 | 2.8 |
| OVTR (cc/m²/Day) – 23°C/0%RH | 0.2 | 0.2 | 0.3 |

(*): folding conditions: 1 time then 2 ways with a 2 kg roll

FIGURE 13 Draw-down Over-Coating of 21-micron film: PVOH-coated AlOx BOPP films with barrier performances at WVTR @ 38°C/90%RH - OTR @ 23°C/0%RH

| Over-Coating | AlOx alone | AlOx + Over-Coating | AlOx + Over-Coating + Folding (*) | AlOx + Over-Coating + 2% Elongation |
|---|---|---|---|---|
| Acrylic | 1.5 - 0.2 | 1.6 - 0.06 | 1.8/2.5 - 0.8 vs 1.4 - 0.2 without Over-Coating | 1.4 - 0.1 vs 2.8 - 0.3 without Over-Coating |
| Stryrene-Acrylic | 1.5 - 0.2 | 1.5 - 0.2 | 1.4 - 0.2 vs 1.4 - 0.2 without Over-Coating | 1.7 - 0.2 vs 2.8 - 0.3 without Over-Coating |
| PolyUrethane | 1.5 - 0.2 | 1.7 - 0.1 | 1.6 - 0.9 vs 1.4 - 0.2 without Over-Coating | 1.9 - 0.1 vs 2.8 - 0.3 without Over-Coating |
| PVOH | 1.5 - 0.2 | 1.6 - 0.06 | 1.8/2.5 - 0.8 vs 1.45 - 0.2 without Over-Coating | 1.4 - 0.1 vs 2.8 - 0.3 without Over-Coating |

FIGURE 14 Over-Coating: Flexography on 18-micron Coextruded-EVOH AlOₓ with Barrier performances at WVTR @ 38°C/90%RH - OTR @ 23°C/0%RH with Over-Coating 0.16/0.22 g/m²

| Over-Coating | AlOₓ alone | AlOₓ + Over-Coating | AlOₓ + Over-Coating + Folding (*) | AlOₓ + Over-Coating + 2% Elongation |
|---|---|---|---|---|
| Acrylic | 1.9 - 5.6 | 3.1 - 16.1 | 3.1 - 19 vs<br>2.1 - 8.5 without Over-Coating | 3.9 - 27 vs<br>3.8 - 44.6 without Over-Coating |
| Stryrene-Acrylic | 1.9 - 5.6 | 3.3 - 20.5 | 3.2 - 20.2 vs<br>2.1 - 8.5 without Over-Coating | 4.5 - 43 vs<br>3.8 - 44.6 without Over-Coating |
| PVOH | 1.9 - 5.6 | 2.1 - 0.0 | 1.6 - 0.02 vs<br>2.1 - 8.5 without Over-Coating | 2.1 - 0.1 vs<br>3.8 - 44.6 without Over-Coating |

FIGURE 15 Over-Coating: Flexography on 21 micron Coated-PVOH AlOₓ with barrier performances: WVTR @ 38°C/90%RH - OTR @ 23°C/0%RH with Over-Coating 0.10/0.25 g/m²

| Over-Coating | AlOₓ alone | AlOₓ + Over-Coating | AlOₓ + Over-Coating + Folding (*) | AlOₓ + Over-Coating + 2% Elongation |
|---|---|---|---|---|
| Acrylic | 1.5 - 0.2 | 2.8 - 0.06 | 2.6 - 0.07 vs<br>1.4 - 0.2 without Over-Coating | 3.1 - 0.1 vs<br>2.8 - 0.3 without Over-Coating |
| Stryrene-Acrylic | 1.5 - 0.2 | 2.7 - 0.13 | 2.5 - 0.1 vs<br>1.4 - 0.2 without Over-Coating | 2.9 - 0.1 vs<br>2.8 - 0.3 without Over-Coating |
| PVOH | 1.5 - 0.2 | 2.0 - 0.02 | 1.7 - 0.01 vs<br>1.4 - 0.2 without Over-Coating | 2.3 - 0.01 vs<br>2.8 - 0.3 without Over-Coating |

FIGURE 16    Barrier Results on Adhesive-Laminated Films with AlOx

| Structure | WVTR (g/m²/Day) | | O2TR (cm³/m²/Day) | |
|---|---|---|---|---|
| | Before Lamination | After Lamination | Before Lamination | After Lamination |
| 20 Micron Printed BOPP / Adhesive / AlOx 18 micron coextruded-EVOH BOPP | 1.8 | 1.1 | 2.6 | 0.9 |
| 20 micron Printed BOPP / Adhesive / AlOx 21 micron coated-PVOH BOPP | 1.5 | 1.6 | 0.2 | 0.1 |
| 20 micron Printed BOPP / Adhesive / AlOx 18 micron EVOH coated BOPP | NA | 2.5 | 0.5 | 0.2 |

*Lab Request Ref:*
*201601-0016 : Barrier properties after lamination*

FIGURE 17  Barrier Results after Mechanical Elongation on Adhesive-Laminated Films with AlOx

O2TR (cm³/m²/Day)

| Laminate structure | Standard | After 0.5% elongation | After 1% elongation | Mechanical Conditions After 1.5% elongation | After 2% elongation | After 20 Gelbo flex | After 5 Gelbo flex | After VFFS process |
|---|---|---|---|---|---|---|---|---|
| 18 micron coextruded-EVOH BOPP AlOx / Adhesive / 20 micron BOPP | 3.5 | 3.7 | 3.8 | 10.2 | 21.2 | 21.3 | 9.2 | 3.4 |
| 21 micron coated-PVOH BOPP AlOx / Adhesive / 20 micron BOPP | 0.1 | 0.02 | 0 | 0.02 | 0.01 | 0.02 | 0.03 | 0.01 |
| 21 micron coated-PVOH BOPP AlOx / Adhesive / 70 micron PE | 0.03 | 0.14 | 0.02 | 0.02 | 0 | 0.03 | 0.14 | 0 |

WVTR (g/m²/Day)

| Laminate structure | Standard | After 0.5% elongation | After 1% elongation | Mechanical Conditions After 1.5% elongation | After 2% elongation | After 20 Gelbo flex | After 5 Gelbo flex | After VFFS process |
|---|---|---|---|---|---|---|---|---|
| 18mic EVOH coex BOPP AlOx/20mic BOPP | 1.8 | 2 | 1.9 | 2.6 | 2.8 | | | 1.6 |
| 21mic PVOH coated BOPP AlOx/20mic BOPP | 1.1 | 0.9 | 1 | 1.3 | 2.7 | | | 0.8 |
| 21mic PVOH coated BOPP AlOx/70 mic PE | 1.2 | 0.9 | 1.1 | 1.2 | 1.5 | | | 1 |

Lab Request Ref:
201607-0052

FIGURE 18  Adhesive Lamination of Films with AlOx - Bond Strengths after Lamination

| Structure | Condition | Bond Strength Average (g/25mm) |
|---|---|---|
| 20 micron Printed BOPP / Adhesive / AlOx / 18 micron coated-EVOH BOPP | Standard | 75 |
| 50 micron PE / Adhesive / AlOx / 21 micron coated-PVOH BOPP | Standard | 145 |
| 20 micron Printed BOPP / Adhesive / AlOx / 18 micron Coextruded-EVOH BOPP | Standard | 155 |
| 20 micron Printed BOPP / Adhesive / AlOx / 21 micron coated-PVOH BOPP | Standard | 265 |
| 50 micron PE / Adhesive / AlOx / 21 micron coated-PVOH BOPP | in seal (130°C - 0,5 sec - Crimp Tr.) | 140 |
| 20 micron Printed BOPP / Adhesive / AlOx / 18 micron coated-EVOH BOPP | in seal (130°C - 0,5 sec - Crimp Tr.) | 230 |
| 20 micron Printed BOPP / Adhesive / AlOx / 21 micron coated-PVOH BOPP | in seal (130°C - 0,5 sec - Crimp Tr.) | 245 |
| 20 micron Printed BOPP / Adhesive / AlOx / 18 micron coextruded-EVOH BOPP | in seal (130°C - 0,5 sec - Crimp Tr.) | 250 |

*Lab Request Ref:*
*201601-0016 : Bond Strength after lamination*

FIGURE 19  Extrusion Lamination of Films with AlOx

Bond Strength Results (g/25mm) for Extrusion Lamination of Films with AlOx

| Structure | Initial | | After 7 days | |
|---|---|---|---|---|
| | Average | Peak | Average | Peak |
| 18 micron Printed BOPP / Extrudate / AlOx / 18 micron coextruded-EVOH BOPP | 245 | 945 | 125 | 774 |
| 18 micron Printed BOPP / Extrudate / AlOx / 21 micron coated-PVOH BOPP | 57 | 848 | 136 | 1265 |
| 18 micron Printed BOPP / Extrudate / AlOx / 18 micron coated-EVOH BOPP | 891 | 1557 | 88 | 1401 |

Barrier Results for Adhesive Extrusion Lamination of Films with AlOx

| Structures | WVTR (g/m2/Day) Average | OTR (cc/m2/Day) Average |
|---|---|---|
| 18 micron Printed BOPP / Extrudate / AlOx / 18 micron coextruded-EVOH BOPP | 2 | 7.2 |
| 18 micron Printed BOPP / Extrudate / AlOx / 21 micron coated-PVOH BOPP | 2.1 | 0.04 |
| 18 micron Printed BOPP / Extrudate / AlOx / 18 micron coated-EVOH BOPP | 2.5 | 0.24 |

*Lab Request Ref:*
*201603-0040*

FIGURE 20    UV Barrier results

List of Samples

Sample 1: 21 micron Coextruded-EVOH BOPP AlOx
Sample 2: 18 micron Coated-EVOH BOPP AlOx
Sample 3: 12 PET Corona AlOx
Sample 4: BOPP Laminate containing SiOx
Sample 5: 18 micron Coated-EVOH BOPP
Sample 6: 30 micron non-EVOH & PVOH BOPP
Sample 7: 18 micron Coextruded-EVOH BOPP AlOx
Sample 8: 12 PET Corona AlOx with an UV-Barrier Coating

UV-Barrier Table

| Sample | UV transmission 200-390 nm (%) | UV-C transmission 200-280 nm (%) | UV-B transmission 280-340 nm (%) | UV-A transmission 340-390 nm (%) |
|---|---|---|---|---|
| Sample 1 | 88.1 | 79.9 | 93 | 95.2 |
| Sample 2 | 76.3 | 53.5 | 90.9 | 95.2 |
| Sample 3 | 63.7 | 36.7 | 79.7 | 87.6 |
| Sample 4 | 86.5 | 70.8 | 95.4 | 99 |
| Sample 5 | 76.5 | 53.1 | 91.6 | 95.8 |
| Sample 6 | 89.2 | 77.5 | 96.8 | 98.9 |
| Sample 7 | 89.3 | 81 | 94.2 | 96.6 |
| Sample 8 | 7.6 | 3.7 | 2.9 | 19.6 |

HIGH-BARRIER, METAL OXIDE FILMS

REFERENCE TO RELATED APPLICATIONS

This application is a continuation, which claims priority to PCT patent application serial number PCT/US17/65648 filed on Dec. 11, 2017 that claims priority to U.S. provisional patent application Ser. Nos. and 62/469,967 filed on Mar. 10, 2017 and 62/432,284 filed on Dec. 9, 2016, wherein each of these applications are incorporated by this reference in their entireties.

FIELD

This disclosure relates to compositions, structures, and methods for making high-barrier films with thin metal-oxide depositions that may include additional functionalized layer(s) and/or be laminated along with other desirable properties in the film and laminate industries.

BACKGROUND

Films may be used in industry to package, wrap, label, and/or protect consumable and non-consumable goods. Oftentimes, providers of such goods also want to couple such desired functionalities with aesthetic and cost-effectiveness. Accordingly, films and methods of the preset disclosure provide solutions to one or more of the foregoing, exemplified goals or desires of commercial film usage.

SUMMARY

This disclosure provides compositions and methods for a transparent, translucent or white film, which may include a base film and a coating layer on the base film, wherein the coating layer has a surface energy of at least 30 dynes/cm and consists essentially of nylon, polyester, ethylene vinyl alcohol-based copolymer, polyvinyl alcohol-based polyethylene terephthalate, polyvinylchloride, acrylate-based polymers, methacrylate-based polymers, polyurethane, polyalkylimine, acid-modified polyolefins, polyetherester-amide block copolymer, and combinations thereof. Further, the film may include a metal oxide layer on the coating layer, wherein the metal oxide layer has an optical density of equal to or less than 0.5 and a thickness from 0.1 nm through 100 nm. In various embodiments, the metal-oxide on the coating layer, whether treated and/or primed beforehand, via plasma-assisted deposition, coating, or otherwise. Further still, the film has an oxygen transmission rate of less than 4 $cm^3/m^2$/day at 23° C. and 0% relative humidity, a water vapor transmission rate of less than 4 $g/m^2$/day at 38° C. and 90% relative humidity, and a thickness of 5 μm through 50 μm. The transparency, translucency or whiteness of the film depends on multiple factors, but chief among them are the optical density of the metal-oxide layer and the base film, wherein a clear base film and thin metal-oxide layer, e.g., 0.5 μm to 0.4 μm to 0.3 μm to 0.2 μm to 0.1 μm or less, coupled with a clear base film may result in a transparent or at least translucent film to some extent. A thicker metal-oxide layer and/or a white base film is unlikely to result in a transparent film; at best, it may result in a film with limited translucency.

BRIEF DESCRIPTION OF THE SEVERAL VIEWS OF THE DRAWINGS

So that the manner in which the above recited features, advantages and objects of the present disclosure are attained and can be understood in detail, a more particular description of this disclosure, briefly summarized above, may be had by reference to the embodiments thereof which are illustrated in the appended drawings.

It is to be noted, however, that the appended drawings illustrate only typical embodiments of this disclosure and are therefore not to be considered limiting of its scope, for this disclosure may admit to other equally effective embodiments.

FIG. 4 presents example overcoating performances using different overcoating processes on metal-oxide films in accordance with this disclosure.

FIG. 5 presents example barrier performances after mechanical constraints such as 2% Elongation and Gelbo flexes on metal-oxide films in accordance with this disclosure.

FIG. 6 presents example oxygen transmission rates and water-vapor transmission rates for a BOPP film coated with aluminum oxide that has various combinations of pre- and post-plasma treatments in accordance with this disclosure.

FIG. 7 presents example oxygen transmission rates and water-vapor transmission rates for a BOPP film coated with aluminum oxide that has various combinations of pre- and post-plasma treatments in accordance with this disclosure.

FIG. 8 presents example oxygen transmission rates and water-vapor transmission rates for laminated films coated with aluminum oxide after elongation tests in accordance with this disclosure.

FIG. 9 presents example oxygen transmission rates and water-vapor transmission rates for laminated films coated with aluminum oxide after flexibility tests in accordance with this disclosure.

FIG. 10 presents barrier performances using different metal-oxide deposition process parameters on metal-oxide films in accordance with this disclosure.

FIG. 11 presents barrier performances using different metal-oxide deposition process parameters on metal-oxide films in accordance with this disclosure.

FIG. 12 presents example barrier and robustness performances of metal-oxide films in accordance with this disclosure.

FIG. 13 presents example oxygen transmission rates and water-vapor transmission rates for draw-down, PVOH-overcoated, metal-oxide films in accordance with this disclosure.

FIG. 14 presents example oxygen transmission rates and water-vapor transmission rates for flexographic EVOH-overcoated, metal-oxide films in accordance with this disclosure.

FIG. 15 presents example oxygen transmission rates and water-vapor transmission rates for flexographic PVOH-overcoated, metal-oxide films in accordance with this disclosure.

FIG. 16 presents example barrier performances for adhesive-laminated, metal-oxide films in accordance with this disclosure.

FIG. 17 presents example barrier performances for adhesive-laminated, metal-oxide films after elongation and folding in accordance with this disclosure.

FIG. 18 presents example bond strengths for adhesive-laminated, metal-oxide films in accordance with this disclosure.

FIG. 19 presents example bond strengths and barrier performances for extrusion-laminated, metal-oxide films in accordance with this disclosure.

FIG. 20 presents example ultraviolet barrier performances for various films in accordance with this disclosure.

DETAILED DESCRIPTION

Figure 1:
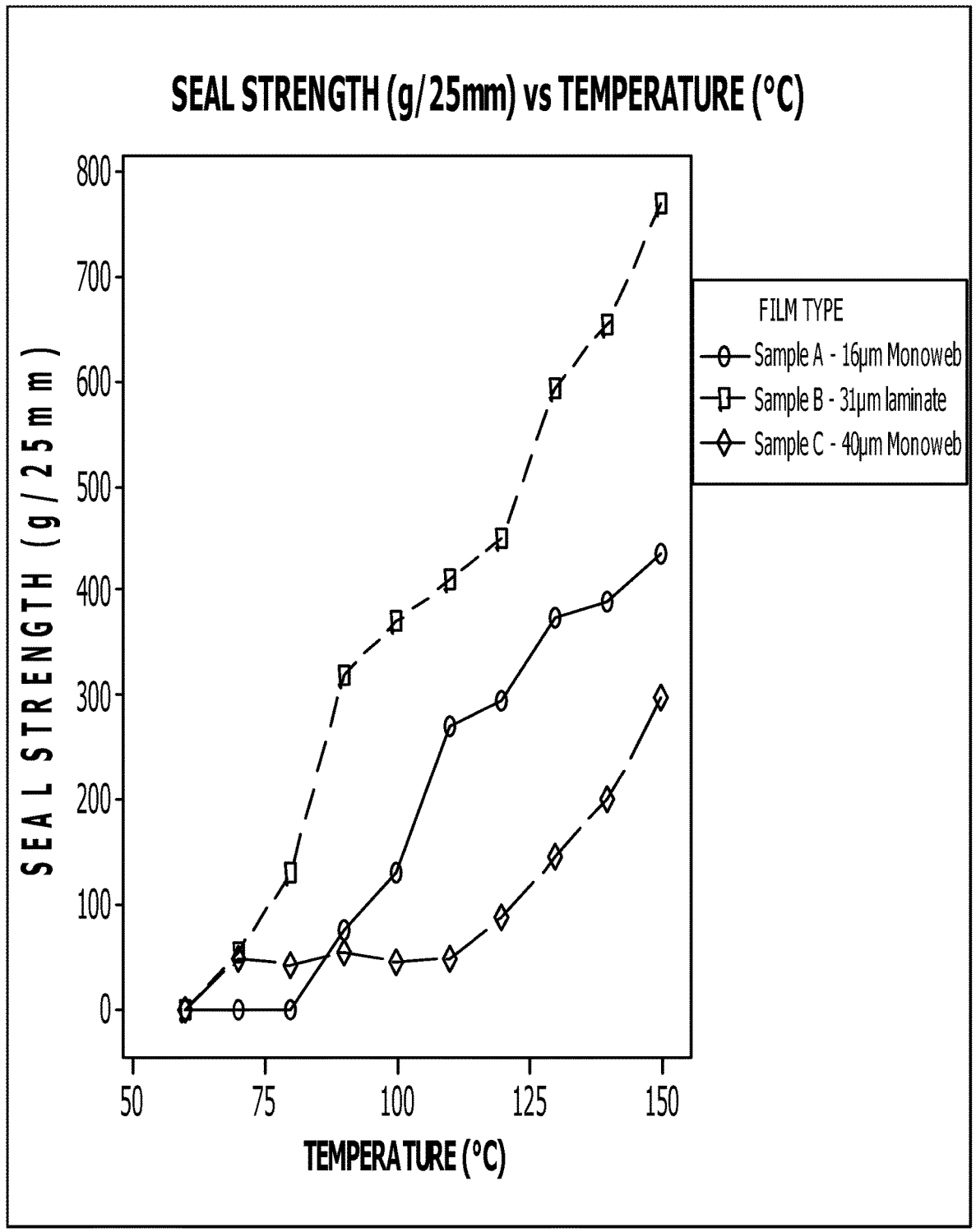
FIG. 1 presents example sealing performances for overcoated, metal-oxide films in accordance with this disclosure.

Below, directional terms, such as "above," "below," "upper," "lower," "front," "back," "top," "bottom," etc., are used for convenience in referring to the accompanying drawings. In general, "above," "upper," "upward," "top," and similar terms refer to a direction away the earth's surface, and "below," "lower," "downward," "bottom," and similar terms refer to a direction toward the earth's surface, but is meant for illustrative purposes only, and the terms are not meant to limit the disclosure.

Various specific embodiments, versions and examples are now be described, including exemplary embodiments and definitions that are adopted herein for purposes of understanding. While the following detailed description gives specific embodiments, those skilled in the art will appreciate that these embodiments are exemplary only, and that the disclosure can be practiced in other ways. For purposes of determining infringement, the scope of the invention will refer to the any claims, including their equivalents, and elements or limitations that are equivalent to those that are recited.

Generally disclosed are compositions, structures, and methods regarding a thin metal oxide layer coated or deposited, under vacuum, on a treated, ethylene vinyl alcohol ("EVOH") or poly(vinyl) alcohol ("PVOH") coated or coextruded base film, which may include a biaxially oriented polyethylene (BOPE), polypropylene ("BOPP"), polyethylene-polypropylene ("BOPP-PE"), polyester ("BOPET"), polyamide ("BOPA"), polylactic acid ("BOPLA"), polyethylene naphthalate ("BOPEN") polyester-polyethylene naphtholate ("BOPET-PEN"), other film(s) or combinations thereof in the core optionally coextruded and/or coated with one or more additional layers, e.g., tie(s), skin(s), sealant layer(s), barrier layer(s), metallized layer(s), metal-coated layer(s), printable layer(s), combinations thereof, in order to result in a high-barrier, flexible film that is translucent, transparent, or even clear depending on the collective composition of the particular substrate's layers. In some embodiments, the thin $AlO_x$ layer may include a protective skin, which, for example, may retard film degradation, and possibly consequential free-radical behavior and/or rancidity of goods enclosed by containers of disclosed film, from light having wavelengths within a specific range of or the entirety of the UV spectrum.

Polymeric film structures are used in many commercial applications, such as in food packaging. Film structures used in the food packaging industry may be selected to provide desirable features for proper food containment. Those features may include controlling water vapor, oxygen, other gases, flavors, aromas and mineral oil barrier properties. As a means of providing such barrier properties, one or both of the outer exposed surfaces of a film may be surface-treated to increase the surface energy of the film to render the film receptive to metal/aluminum, coatings, printing inks and/or lamination, e.g., adhesive or extrusion. See e.g., U.S. Pat. No. 4,345,005. The surface treatment may be carried out according by one of the methods known in the art, including, but not limited to, corona discharge, flame treatment, plasma treatment, or chemical treatment, such as for in-line coating processes. Such treatments are described, for example, in U.S. Pub. Pat. No. 2011/0318589, which discusses treating for a metallizable film layer, namely, a high surface energy polymer such as ethylene vinyl alcohol copolymer ("EVOH") or poly vinyl alcohol copolymer ("PVOH").

Despite the foregoing, it is desirable to impart such a barrier to a transparent film. This may be accomplished by applying metal oxide layers, such as in U.S. Pat. Nos. 5,688,556; 5,792,550 and 5,981,079. Such metal oxide barriers allow transparency, if desired, while maintaining lower water vapor and oxygen transmissions. However, given the thin and brittle nature of such metal-oxide-coated films, there are still concerns with maintaining the water vapor and oxygen barriers when the films are processed or otherwise handled. Accordingly, what is desired are stronger, more durable films with metal oxide barrier coatings.

The present disclosure is directed to films and the processes of making films that are useful in packaging and/or labeling applications, where low water and oxygen permeability are desirable. The films may be transparent or colored, such as white. Most desirably, the films are transparent. The disclosed films and methods may be achieved, at least in part, by pre-metal-oxidization and optional post-metal-oxidization treatment(s) of a polymer film having a high-surface-energy-polymer surface. The high-surface-energy polymer may be both pre- and/or post-metal-oxidization treated. One method of treating this surface of the high-surface-energy polymer is plasma treatment, and, thus, the method is often referred to as "pre-plasma" treatment and "post-plasma" treatment. Any equipment suitable for isolating the film to be metal-oxidized, holding an adequate vacuum, vaporizing a desirable metal and imparting the oxidizing treatments may be used. Example metal-oxidizing conditions are described further herein.

Low-energy plastics, such as polypropylenes ("PP"), polyethylene ("PE") and polytetrafluoroethylene ("PTFE," e.g., Teflon®) are essentially "non-stick" plastics. Their molecular structure inhibits the adhesion and printing processes. This molecular structure is basically inert or inactive. These polymers are said to have a low surface energy. The surface energy or the wetability of a particular substrate is measured in dynes/cm (or $ergs/cm^2$), and when tested, untreated PP and PE will have a low surface energy (usually 30 to 32 dynes/cm) (ASTM D2578). The most common method of determining the surface energy is to measure the contact angle of a water droplet on the substrate surface. The contact angle between the solid and the fluid is the angle measured within the fluid, between the solid surface and the tangent plane to the liquid surface at the point of intersection. A contact angle of greater than 90° indicates that the fluid (which is ink or adhesive in this case) has not wet the surface. Conversely, an angle of less than 90° means that the fluid has wet the surface. In the case where the angle approaches zero then the surface is completely wetted by the fluid.

The use of a corona, flame, plasma, chemical or other surface treatment will raise the surface-energy level to values which may be higher than 42 dynes/cm. Surprisingly, by starting with a high-surface-energy polymer further enhances this effect. Ideally, the surface energy of the plastic should be 7 to 10 dynes/cm higher than the surface tension of the substance (solid or liquid) that will bind to the surface.

For example, a printing ink having a surface tension of 30 dynes/cm would not adequately wet or bond to a material having a surface energy less than 37 to 40 dynes/cm.

A plasma is a mixture of free electrons, ions, radicals and molecular fragments created when an electrical field or microwaves is/are applied to a gas. Surprisingly, by treating polymer surfaces with a plasma improves bondability in several ways. First, it removes grease and other organic contaminants that inhibit adhesion. Secondly, it etches the surface of the plastic at a microscopic level, which improves the bond's mechanical strength. And, third, plasma chemically activates the surface of the plastic, making it more wettable and more likely to react with an adhesive. Surprisingly, a desirable sequence of such treatments on a particular high-surface-energy polymer's layers of a film will enhance the overall performance of the film.

Disclosed are films are processes for producing a colored or transparent, preferably transparent, metal-oxidized films. The process may include providing a film having two surfaces, at least one of which comprises a high-surface-energy polymer, wherein the high-surface-energy polymer has a surface energy (ASTM D2578) of at least 30 dynes/cm or 32 dynes/cm, a Young's Modulus (ASTM D790) of at least 1500 MPa or 1600 MPa or 2000 MPa, and a melting point (ASTM D3418) of at least 130° C. or 135° C. or 140° C. The film may have any number of layers, but preferably is a 5-layer film wherein the high-surface-energy polymer's layer is exposed on one face and adhered to a core film layer on its other face, with or without an intervening film layer. The pre-plasma step may include imparting a first oxidizing plasma to the high-surface-energy polymer's surface of the film, followed by depositing a layer of metal oxide on the oxidized high-surface-energy-polymer surface to produce a metal-oxide surface adhered to the exposed surface of the high-surface-energy polymer. Optionally, but preferably, a post-plasma step may involve imparting a second oxidizing plasma to the metal oxide layer. A metal-oxidized film may then be used alone or adhered to some substrate, such as by lamination or over-coating, for further use.

In one example embodiment, the disclosed composition may include a base film, such as an oriented polypropylene film having at least a core layer comprising polypropylene and a layer/coating comprising (or consisting essentially of, or consisting of) the high-surface-energy polymer. The metal-oxidized films, which may be made from polypropylene films, are transparent or colored, preferably transparent, and have a MO/A/B/C/D structure comprising a core layer (C) comprising (or consisting essentially of or consisting of) polypropylene, the core layer having a first and second side; an adhesive layer (B) on the first side of the core layer; the high-surface-energy polymer layer/coating (A) adhered to the adhesive layer, wherein the high-surface-energy polymer is as described herein; a metal-oxide layer (MO) on the high-surface-energy polymer layer; and optionally a skin layer (D) on the second side of the core layer. The disclosed, metal-oxidized layer may have a total thickness within the range of from 10 nm or 12 nm to 20 nm or 26 nm or 30 nm, and an optical density of less than 0.5 or 0.2 or 0.1 or 0.05 or 0.04 or 0.03 O.D. If colored, the pigment or coloring agent may be one or many optional additives, which are further discussed in the next paragraph, and may be preset in any one or more of the film's layers.

The core may include BOPE, BOPP, BOPET, BOPA, BOPLA, BOPEN, BOPET-PEN, other film(s) or combinations thereof optionally along with additional layers to form a coated and/or coextruded multi-layered film ("substrate") ranging in opacity from translucent to transparent to clear depending on the substrate's collective composition. Any or all of the layers within the substrate may include additives, such as but not limited to the following agents: slip, anti-static, cavitating, flame-retardant, oxygen-scavenger, anti-mold, anti-bacteria, UV-absorber (e.g., $TiO_2$, ZnO, trizaine, amines, oxanilides, benzotriazole, etc.), other light-absorber, pigment, oxidative, tagging, preservative, filler, etc. Furthermore, the layers, themselves, may include elastomers, plastomers, and/or soft polymers, which are defined as being those polymers having a flexural modulus (ASTM D790) of less than about 80 kpsi (552 MPa), preferably, less than about 50 kpsi (345 MPa), and most preferably less than about 20 kpsi (138 MPa). Additionally or alternatively, soft polymers are defined as being those polyolefin copolymers or terpolymers having a melting point temperature equal to or less than about 288° F. (142° C.), more preferably equal to or less than about 248° F. (120° C.), and most preferably equal to or less than about 212° F. (100° C.). Additionally or alternatively, soft polymers are defined as being those resins having a Vicat softening point (VSP) (ASTM D1525) of less than or equal to about 221° F. (105° C.), more preferably of less than or equal to about 176° F. (80° C.), and most preferably of less than or equal to about 150° F. (65° C.).

The polypropylene of the core (C) layer of the film to be metal-oxidized may be a homo-polymer, copolymer comprising from 60 wt % or 70 wt % or 80 wt % or 85 wt % or 90 wt % or 95 wt % or 98 wt % or 99 wt % to 100 wt % propylene-derived units (and comprising within the range of from 0 wt % or 1 wt % or 5 wt % to 10 wt % or 15 wt % or 20 wt % or 30 wt % or 40 wt % $C_2$ and/or $C_4$ to $C_{10}$ α-olefin derived units), or mixtures thereof, and may be made by any desirable process using any desirable catalyst as is known in the art, such as a Ziegler-Natta catalyst, a metallocene catalyst, other single-site catalyst(s), using solution, slurry, high pressure, or gas phase processes, or combinations thereof. Polypropylene copolymers are useful polymers in certain embodiments, especially copolymers of propylene with ethylene and/or butene, and comprise propylene-derived units within the range of from 70 wt % or 80 wt % to 95 wt % or 98 wt % by weight of the polypropylene. In any case, useful polypropylenes have a melting point (ASTM D3418) of at least 125° C. or 130° C. or 140° C. or 150° C. or 160° C., or within a range of from 125° C. or 130° C. to 140° C. or 150° C. or 160° C. A "highly crystalline" polypropylene is useful in certain embodiments, is typically isotactic, comprises 100 wt % propylene-derived units (propylene homopolymer) and has a relatively high melting point of from 140° C. or 145° C. or 150° C. or 155° C. or 160° C. or 165° C. to higher.

The term "crystalline," as used herein, characterizes those polymers which possess high degrees of inter- and intra-molecular order. The polypropylene has a heat of fusion ($H_f$) greater than 60 J/g or 70 J/g or 80 J/g, as determined by DSC analysis. The heat of fusion is dependent on the composition of the polypropylene. The thermal energy for the highest order of polypropylene is estimated at 189 J/g that is, 100% crystallinity is equal to a heat of fusion of 189 J/g. A polypropylene homo-polymer will have a higher heat of fusion than a copolymer or blend of homo-polymer and copolymer. Also, the polypropylenes useful herein may have a glass transition temperature (ISO 11357-1, $T_g$) preferably between −20° C. or −10° C. or 0° C. to 10° C. or 20° C. or 40° C. or 50° C. The polypropylenes have a Vicat softening temperature (ISO 306, or ASTM D1525) of greater than 120° C. or 110° C. or 105° C. or 100° C., or within a range of from 100° C. or 105° C. to 110° C. or 120° C. or 140° C. or 150° C. or a particular range of from 110° C. or 120° C. to 150° C.

As used herein, "polymer" may be used to refer to homopolymers, copolymers, interpolymers, terpolymers, etc. Likewise, a "copolymer" may refer to a polymer comprising two monomers or to a polymer comprising three or more monomers.

As used herein, "elastomer" is defined as a propylene-based or ethylene-based copolymer that can be extended or stretched with force to at least 100% of its original length, and upon removal of the force, rapidly (e.g., within 5 seconds) returns to its original dimensions.

As used herein, "plastomer" is defined as a propylene-based or ethylene-based copolymer having a density in the range of 0.850 g/cm3 to 0.920 g/cm$^3$ and a DSC melting point of at least 40° C.

The polypropylene has a melt flow rate ("MFR", 230° C., 2.16 kg, ASTM D1238) within the range of from 0.1 g/10 min or 0.5 g/10 min or 1 g/10 min to 4 g/10 min or 6 g/10 min or 8 g/10 min or 10 g/10 min or 12 g/10 min or 16 g/10 min or 20 g/10 min. Also, the polypropylene may have a molecular weight distribution (determined by GPC) of from 1.5 or 2.0 or 2.5 to 3.0 or 3.5 or 4.0 or 5.0 or 6.0 or 8.0, in certain embodiments. Suitable grades of polypropylene that are useful in the oriented films described herein include those made by ExxonMobil, LyondellBasell, Total, Borealis, Japan Polypropylene, Mitsui and other sources.

The film used to make the disclosed metal-oxidized film, e.g., AlO$_x$-BOPP film, may be manufactured by any suitable method known, and may be manufactured by co-extruding the three, four or five layers together in the desired compositions and thicknesses as described, for example, elsewhere herein. In certain embodiments, the disclosed films (or labels) may also be characterized as being biaxially oriented in certain embodiments. Examples of methods of manufacturing the films and labels may include a tentered or blown process, LISIM™ and others. Further, the working conditions, temperature settings, lines speeds, etc. will vary depending on the type and the size of the equipment used. Nonetheless, described generally here is one method of making the films described throughout this specification. In an example embodiment, the films may be formed and biaxially oriented using the "tentered" method. In the tentered process, line speeds of greater than 100 m/min to 400 m/min or more and outputs of greater than 2000 kg/hr to 4000 kg/hr or more are achievable. In the tenter process, the various materials that make up the film layers are melt blended and coextruded, such as through a 3, 4, 5, 7-layer die head, into the desired film structure.

The so-called "adhesive" (B) layer can be made by any desirable polymer composition known to promote the adhesion of a relatively polar polymer (such as the high surface energy polymer) to the polypropylene core. Suitable polymers include polyolefins such as polyethylene, polypropylene, polybutylene, and copolymers of ethylene-propylene and ethylene-propylene-butylene. Also suitable as adhesive layers are acid-modified versions of these polymers, such as maleic anhydride modified polymers. Mitsui's Admer™ series of polymers are suitable examples for adhesive layers of the film. Yet further acceptable polymers are soft polymers, which may be may be defined to include those homopolymers, copolymers, terpolymers, or other polymers having at least one of the following properties: melting point temperature less than or equal to 42° C. (288° F.), a Vicat softening point (ASTM D1525) of less than or equal to 105° C. (221° F.); and/or a flexural modulus (ASTM D790) of less than or equal to about 550 MPa (80 kpsi); however, soft polymers exclude common polymer film-forming resins such isotactic polypropylene and high density polyethylene. That is, acceptable soft polymers include polymer resins that are less stiff, have lower modulus, are more flexible and elastic, and tend to have a more plastic stress-strain behavior than isotactic polypropylene and high density polyethylene. Soft polymers will most commonly include those polymers having a flexural modulus (ASTM D790) of less than 550 MPa (80 kpsi). Soft polymers include those polymers having a flexural modulus of less than 345 MPa (50 kpsi), and for some embodiments a flexural modulus of less than 138 MPa (20 kpsi). In some embodiments, the soft polymers will be a polyolefin co- or terpolymer and may have a melting point temperature equal to or less than 142° C. (288° F.), equal to or less than 120° C. (248° F.), and for some embodiments, equal to or less than 100° C. (212° F.). The soft resins may also be defined as those resins having a Vicat softening point (VSP) (ASTM D1525) of less than or equal to 105° C. (221° F.), less than or equal to 80° C. (176° F.), and for some embodiments, less than or equal to 65° C. (150° F.).

For further example, another acceptable resin group includes, but is not limited to, impact copolymers or heterophasic polymer blends that typically contain from 5 to 25 percent by weight of an elastomeric compound to incorporate rubber-like properties to the normally rigid backbone of polypropylene-based polymers. Other heterophasic copolymers, such as those made by Basell's Catalloy™ process may contain over 25 weight percent and even in excess of 50 weight percent of elastomeric compound. For the exemplary Catalloy™ or impact polymers, the elastomeric component of the impact polymer may include, but are not limited to, acrylonitrile-chloroprene copolymer, acrylonitrileisoprene copolymer, butadiene-acrylonitrile copolymer, chlorinated polyethylene, chlorosulfonated polyethylene, ethylene-ether polysulfite, ethylene-ethyl acrylate copolymer, ethylene polysulfite, ethylene-propylene copolymer, ethylenepropylene-diene terpolymer, fluoroelastomer, fluorosilicone, hexafluoropropylene-vinylidene fluoride copolymer, isobutene-isoprene copolymer, organopolysiloxane, acrylic ester-butadiene copolymer, polybutadiene, polychloroprene, polyepichlorohydrin, polyisobutene, polyisoprene, polyurethane, styrene-butadiene copolymer, styrene-chloroprene copolymer, polyethylene-butyl graft copolymer, styrene-butadiene-styrene triblock polymer, and blends thereof.

In addition to the exemplary heterophasic or Catalloy™ impact-type polymers, numerous other polymers or polymer blends are acceptable as the soft polymer. For example, other acceptable polymers may include block copolymers, copolymers and terpolymers including C2-C8 alpha-olefins, and random copolymers. The acceptable soft polymers may be the product of Ziegler-Natta or metallocene catalysis.

The so-called "skin" layer (D) is preferably a polyolefin, such as polyethylene, polypropylene, polybutylene, polystyrene and copolymers of ethylene-propylene and ethylene-propylene-butylene. Particularly, the skin layer may be linear, low-density polyethylene, low-density polyethylene, medium-density polyethylene, high-density polyethylene, or combinations thereof. Soft, elastomeric copolymers may also be used such as copolymers of polypropylene having from 5 to 20 wt % $C_2$ to $C_8$ α-olefin derived units, or copolymers of ethylene having from 10 to 40 wt % $C_2$ to $C_8$ α-olefin derived units, or a combination thereof. Furthermore, the skin layer (D) can be surface-treated with processes such as corona treatment, flame treatment, FLAIR treatment or other processes; the skin layer (D) can also be coated with a coating polymer selected from: nylon, polyester, EVOH, PVOH, PVDC, polyethylene terephthalate, polyvinylchloride, acrylate-based polymers, methacrylate-based polymers, polyurethane, polyalkylimine, acid-modified polyolefins (e.g., maleic anhydride grafted), polyether-ester-amide block copolymer, or blends thereof. Coatings may also include any type of primer coating such as PEI, PU, epoxy, or combinations thereof.

The so called "high-surface-energy" polymer layer (A) is any suitable polymer that can be formed by lamination, extruding, blown, deposited, or coated to make at least a part of a thin film, and characterized as having a surface energy (ASTM D2578) of at least 30 dynes/cm or 32 dynes/cm; or preferably a surface energy within the range of from 30 or 32 to 40 or 45 or 50 or 60 dynes/cm. The high-surface-energy polymer may have a Young's Modulus (ASTM D790) of at least 1500 MPa or 1600 MPa or 2000 MPa or preferably a Young's Modulus within the range of from 1500 MPa to 5000 MPa or 10,000 MPa or 20,000 MPa. The high-surface-energy polymer also has a melting point (ASTM D3418) of at least 130° C. or 135° C. or 140° C. or preferably within the range of from 130 or 140° C. to 170 or 180 or 190° C. Preferably, the high-surface-energy polymer is selected from nylon, polyester, ethylene vinyl alcohol copolymer ("EVOH"), polyvinyl alcohol ("PVOH") polyethylene terephthalate, polyvinylchloride, acrylate-based polymers, methacrylate-based polymers, polyurethane, polyalkylimine, acid-modified polyolefins (e.g., maleic anhydride grafted), polyetherester-amide block copolymer, or blends of any of these.

Preferably, the high-surface-energy polymer is EVOH or PVOH. The EVOH may have an ethylene content within the range of from 35 mol % or 38 mol % or 42 mol % to 54 mol % or 58 mol % or 62 mol % or 65 mol %. The EVOH preferably has a melting point (DSC) of less than 170° C. or 165° C., or within the range of from 130° C. or 140° C. to 170° C. or 180° C. Also, the EVOH preferably has a crystallization temperature (DSC) of greater than 150° C. or 155° C., or within the range of from 120° C. or 130° C. or 135° C. to 145° C. or 150° C. or 160° C. The EVOH preferably has a melt index (2.16 kg, 210° C.) of greater than 12 g/10 min or 13 g/10 min or 13.5 g/10 min or within a range of from 8 g/10 min or 10 g/10 min or 12 g/10 min to 16 g/10 min or 18 g/10 min or 20 g/10 min or 24 g/10 min. PVOH (fully-hydrolyzed polyvinyl alcohol) preferably has a melting point (DSC) of more than 200° C. Also, the PVOH may preferably have a glass transition temperature, $T_g$, of 85° C. A PVOH grade such as Elvanol 90-50 from Kuraray may be a suitable PVOH for use with particular embodiments of the disclosed methods and compositions.

The coated (e.g., reverse direct/direct gravure, offset or flexography) or coextruded EVOH or PVOH layers, may be treated by corona, flame, plasma, or chemical method(s). To this treated, EVOH- or PVOH-surface, a thin layer of $AlO_x$, any Group III or IV metal oxide, or combinations thereof (i.e., although generally discussed herein as $AlO_x$ for convenience) is deposited under vacuum. Acceptable thinness layers of this "thin layer" are within a range from 5 nm to 60 nm, more preferably from 10 to 50 nm, and most preferably from 20 nm to 40 nm, whereby sensors measuring optical density may assist in achieving the desired thickness of the deposited thin layer of metal oxide, such as $AlO_x$. Thereafter, the thin, metal oxide deposition layer is optionally further oxidized and made more dense, for example through use of an plasma unit, in order to blast this thin layer with one or more gases, e.g., oxygen, nitrogen, carbon dioxide, noble, other gas(es), or combinations thereof, in the evaporation chamber. The effect of this post-plasma oxidation improves the surface tension of the resultant film, which may optionally include further extruded, i.e., extrusion lamination, or coated layers aimed at customized functionalities, e.g., one or more printable, barrier, sealability, stiffness, flexible, rough or smooth surface (i.e., coefficient of friction), vapor transmission layers, which are largely achieved through including one or more additives of the kind previously addressed in this disclosure or otherwise known in the art. Either or both outer surfaces of the resultant film may be laminated to another material, such as paper, plastic, cardstock, or film, such as an ultra-high barrier film for applications in photovoltaics, organic light-emitting diodes, printed electronics, and so forth.

Figure 21:
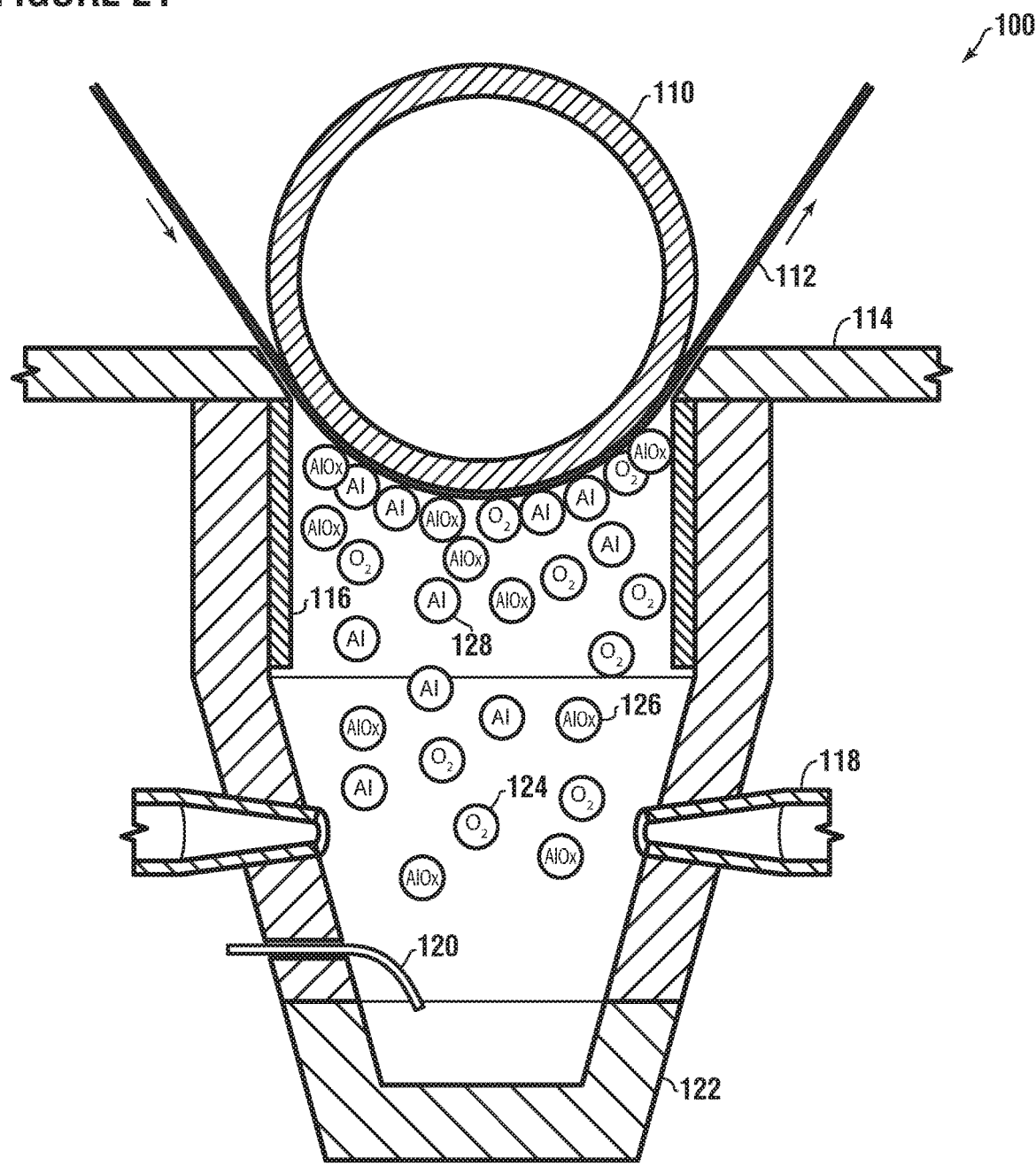
FIG. 21 presents an illustration of a plasma-assisted deposition system for depositing metal oxide on films in accordance with this disclosure.

As previously disclosed, a metal-oxide layer may be put down in various ways. One way is via plasma-assisted deposition, an illustration of which is shown in FIG. 21. One way to optimize putting down the metal-oxide layer is to densify the metal-oxide layer—with objective(s) including achieving high barriers for and/or a thinly depositing metal oxide on a film—is to use a plasma in the evaporation zone. Here, a plasma cathode ionizes gas(es) present between the cathode so as to ionize reactive oxygen, for instance, with a proximate supply of metal in an evaporation boat to result in a deposit of metal oxide on a moving web of film. Ultimate film properties may be determined by selected parameters such as gas flow, power applied, web speed, and so forth. One source for plasma-assisted deposition instrumentation may be Baler Leybold Optics.

With reference to FIG. 21, an illustration of a plasma-assisted deposition system 100 is depicted. A film 112 may proceed through a coating process via a pathway between a coating drum 110 and drum shields 114 that also places the film 112 in contact with a plasma containing gases 124, 126 and 128. In this system 100, aluminum wire 120 is within an evaporation boat 122. Oxygen feeds 118 supply reactive oxygen, which the cathode 116 oxides in the plasma to permit deposit of aluminum oxide onto the film 112 surface exposed to the plasma during the coating process.

The metal-oxide layer may include one or more over-coating(s) ("OC") on the MO side that is opposite of the MO side facing towards A. The protective skin(s) may be in the nature of one or more over-coatings, which may be applied in-line or out-of-line. For purposes of at least mechanical protection as well as possibly others, protective over-coatings may be based on compositions that include acrylic(s) that are styrenated or non-styrenated, polyurethane(s), EVOH and/or PVOH polymer(s), ORganically MOdified CERamics (ORMOCERs), or otherwise, wherein any or all of which may further include primer(s) before application of each or any over-coating(s). Furthermore, such over-coating(s) applied to the thin layer, and/or in coated or coextruded layers located on the other surface of the substrate, optionally having tie layers therebetween, and may include one or more additives of the kind previously addressed in this disclosure or otherwise known in the art.

One or more of the over-coating(s) may be sealable based on compositions including a polyolefin dispersion ("POD") that is coated onto the metal oxide layer, e.g., AlOx layer. The POD may have a high solids' content, e.g., equal or greater than 25% by weight. The POD may be prepared using BLUEWAVE™ technology and processes developed by Dow®. The POD may include one or more ionomers such as Surlyn®, polymers such as elastomers, plastomers, and combinations thereof, ethylene-vinyl-acetate-based ("EVA") polymers, vinyl-alcohol-based ("VOH") polymers, neutralized or not neutralized ethylene acrylic acidic polymers, polypropylene-based polymers, polyethylene-based polymers, organic acids such as maleic-acid-based ("MA"), styrene-block copolymers ("SBC"), amorphous amide polymers, acrylic(s) that are styrenated or non-styrenated, polyurethane(s), EVOH-based and/or PVOH-based polymer(s), ORganically MOdified CERamics (ORMOCERs), or combinations thereof. The foregoing overcoating possibilities may impart one or more of the following functionalities to the film: mechanical protectivity, protect the metal layer, improve or sustain barrier functionality, sealability, and/or printability as well as other functional aspects. In alternate embodiments, the sealing layer may be based on acrylic-based (e.g., EAA-based) polymers, polyurethane-based polymers ("PU"), polyvinylidene-chloride ("PVDC")-based polymers, polyethylene terephthalate ("PETG")-based polymers, co-polyesters or combinations thereof. The sealing layer may further still include additives such as wax(es) and particle such as PMMA, silica or others. In various examples, the dried coating weight of the sealing coating may be within the range of 0.5 to 20.0 g/m², wherein any or all of which may further include primer(s) before application of each or any overcoating(s).

The use of such over-coatings leads to typical static sealing performances with high-pressure sealing machine, e.g., an Otto Brügger machine (ASTM F88), at 400-500 g/inch @ 130° C. with tearing as shown in FIG. 1. We can see the sealing performance of sample A, which is a 16 μm BOPP AlOx film overcoated with low-temperature-sealing coating compared to Sample B, which is its laminate against 15 μm coextruded BOPP film, and sample C, which is a standard BOPP film overcoated with the same sealing coating as in sample B.

Figure 2:
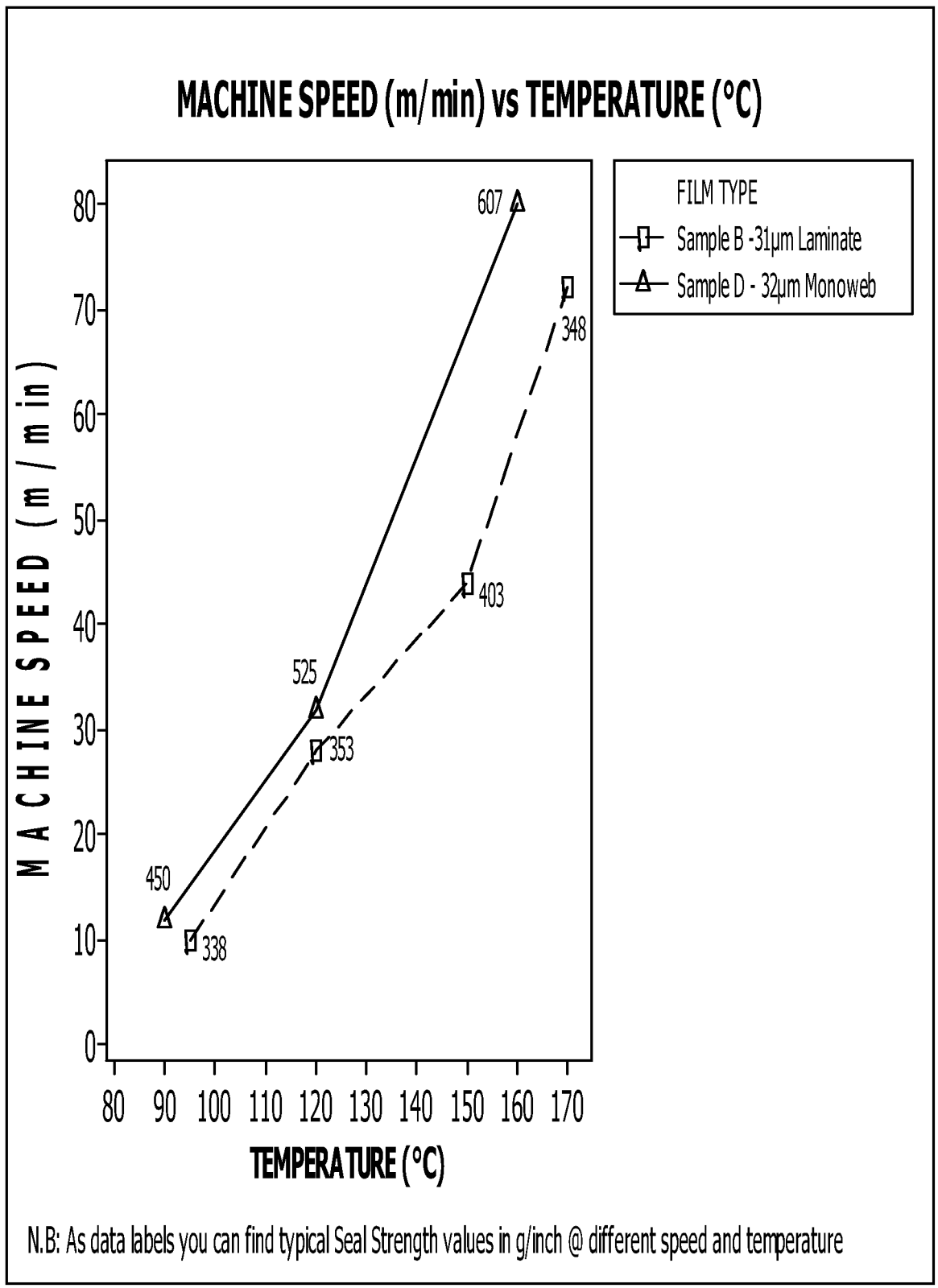
FIG. 2 presents example sealing performances for overcoated, metal-oxide films in accordance with this disclosure.

Then, the use of such over-coatings leads to typical dynamic sealing performances with horizontal form fill and seal machine, e.g., Record Jaguar, at 400-500 g/inch at 150° C. and 40-45 m/min machine speed as shown on FIG. 2. We can see the sealing performance of sample B compared to sample D, which is a standard coextruded BOPP film and sample C, which is a standard high barrier BOPP film overcoated with the same sealing coating as previously.

Figure 3:
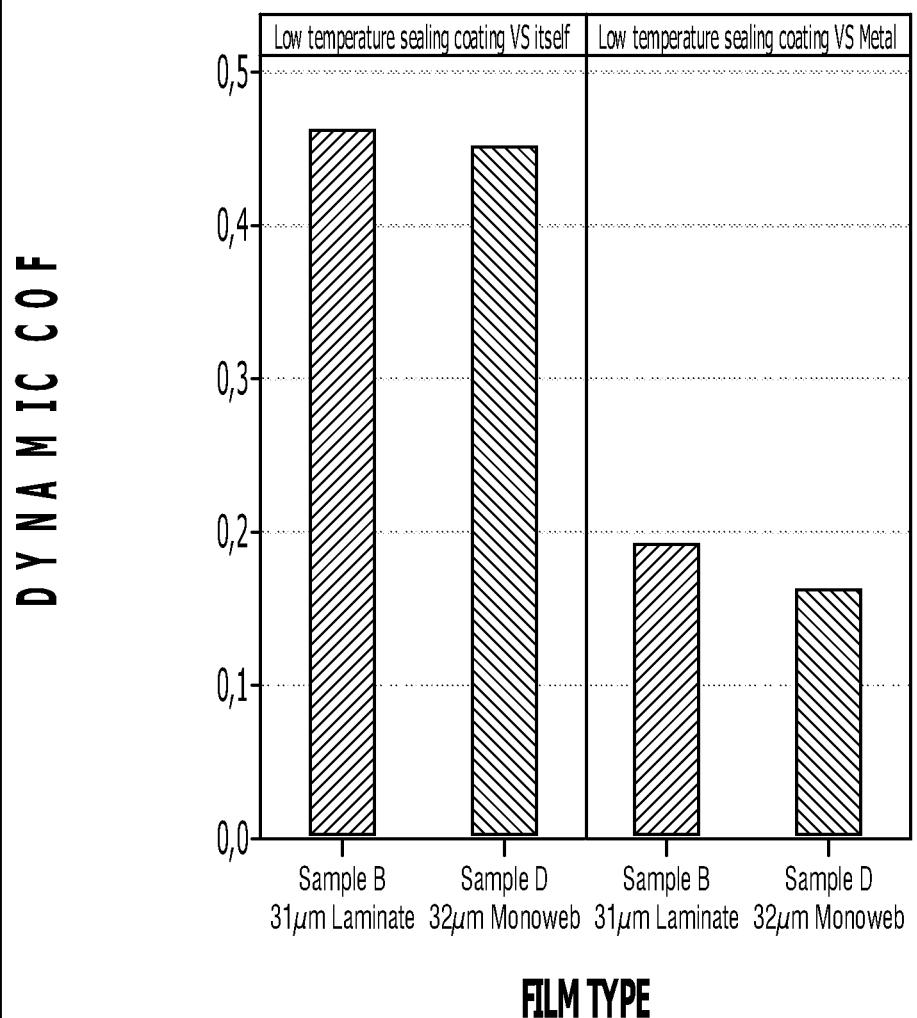
FIG. 3 presents example coefficient of friction performances for overcoated, metal-oxide films in accordance with this disclosure.

Such over-coatings lead to typical dynamic COF values (ASTM D1894) at 0.4-0.5 on sealing side vs. itself, whereas we can observe typical values at 0.17-0.21 on sealing side vs. metal as shown in FIG. 3.

The over-coatings for the high barrier and clear films with metal oxide could also include additional functionality, i.e., be "functionalized," such as by using materials that provide mechanical protection, e.g. sustains functionality despite undergoing some elongation and flexes, printability of the surface of the metal oxide, sealability of the surface of the metal oxide, and so forth. As one example, overcoatings may protect the brittle ceramic/metal oxide layer. Overcoatings that include EAA, polyurethanes (crossed-linked or not), EVOH, PVOH, and combinations thereof may be considered for imparting desirable functionalities.

Regarding fragility and brittleness of the metal oxide layer, care should be taken with overcoating and during the overcoating process to not damage the metal-oxide layer. As examples, three different processes, i.e., flexography/offset, direct gravure and reverse gravure were tested and results from the same are shown in FIG. 4.

Robustness of the overcoated films were evaluated by the barrier performances after mechanical constraints such as 2% Elongation and Gelbo flexes are shown in FIG. 5.

The film having the high-surface-energy polymer layer adhered thereto may be metal-oxidized by any suitable means that results in the disclosed metal-oxidized films. The metal-oxidizing equipment may include at least one large chamber that can be evacuated with little or no vapor from pump oils and is capable of batch metal-oxidizing the film. Desirably, the film is placed in the equipment in the form of a roll and is unrolled while it is pre-plasma treated, metal-oxidized, and then, if desired, post-plasma treated.

The pre-plasma treatment is preferably carried out using a first oxidizing plasma comprising within the range from 5 or 10 wt % to 30 wt % or 50 wt % oxygen, based on the total weight of gas, the remainder being an inert gas, e.g., argon or nitrogen. Preferably, when used, the second/post oxidizing plasma comprises within the range from 60 wt % or 70 wt % to 85 wt % or 95 wt % or 100 wt % oxygen, based on the total weight of gas, the remainder an inert gas.

The pressure within the metalizing chamber may be less than 4 or 2 or $0.5 \times 10^{-4}$ mbar with no flow of gas, and maintained to less than 4 or 2 or $0.5 \times 10^{-3}$ mbar with gas flow during any step (pre-plasma, metal-oxidize, post-plasma) of the process. The surface of the high-surface-energy polymer may be metal-oxidized with a gas pressure of less than $4 \times 10^{-3}$ mbar; or within the range of from $0.1 \times 10^{-3}$ mbar or $0.5 \times 10^{-3}$ mbar or $1.2 \times 10^{-3}$ mbar to $3 \times 10^{-3}$ or $4 \times 10^{-3}$ mbar of pressure. The metal-oxide layer may be oxidized with a gas pressure of less than $4 \times 10^{-2}$ mbar; or within the range of from $1.0 \times 10^{-2}$ mbar or $1.5 \times 10^{-2}$ mbar to $3 \times 10^{-2}$ or $4 \times 10^{-2}$ mbar of pressure. The pressures will vary depending on the amount of oxygen and/or inert gas placed in the chamber during each step.

For both pre- and post-oxidation processes, it may be desirable to use the highest energy that the equipment will allow. Preferably, the oxidizing plasma is generated with a power within the range of from 4 kW or 5 kW to 8 kW or 10 kW 14 kW or 20 kW or 30 kW. The film is preferably unwound, treated and metal-oxidized, then rewound in the metallizer. Preferably, the film is unwound with a tension of from 20 N/m or 30 N/m to 80 N/m or 90 N/m or 100 N/m. Also, preferably the metal-oxidized film is wound with a tension of from 20 N/m or 30 N/m or 40 N/m to 80 N/m or 90 N/m or 100 N/m.

The film, once pre-plasma treated, is metal-oxidized by vaporizing the desired metal. Preferably, aluminum, silicon, other Group III or IV element, or mixture thereof is heated to the desired vaporizing temperature, wherein the vapors are directed to the face of the pre-oxidized film. Oxygen, or oxygen mixed with an inert gas. is added to the metal, inclusive of metalloids, vapor during the metalizing process. The resultant metal oxide layer has a thickness within the range of from 0.1 nm or 0.5 nm or 1 nm to 5 nm or 10 nm or 50 nm or 100 nm.

The resulting metal-oxidized film preferably has an optical density of less than 0.5 or 0.2 or 0.1 or 0.05 or 0.04 or 0.03 O.D. Further, the metal-oxidized film has a water-vapor transmission rate (ASTM F1249), at 90% relative humidity and 38° C., of less than 4 or 3 or 2 or 1 g/m² day. Further, the metal-oxidized film has an oxygen transmission rate (ASTM D3985), at 0% relative humidity and 23° C., of less than 4 to 3 to 2 to 1 cc/m²·day. Finally, the metalized film has a total thickness within the range of from 5 to 8 μm to 9 to 9.5 μm to 10 μm to 12 μm to 20 μm to 26 μm to 30 μm to 40 μm to 50 μm, wherein "to" includes equal to and/or below the specified number here and elsewhere in this disclosure. The same rule applies to "or" when used in discussing values within ranges, e.g., thicknesses, etc.

The resulting metal-oxidized film may be further processed. For example, the metal-oxidized film may be laminated or coated on the metal oxide face of the film with some substrate. Desirable substrates may include polypropylene, polyethylene, polyethylene terephthalate, polyurethane, nylons, cellulosic materials and other plastics or thermoplastics or elastomers. Such a product may be useful, for instance, in packaging articles, especially food products, or labels, especially pressure sensitive labels when an adhesive is present, and also in applications such as security/anti-counterfeiting, photovoltaics, organic light-emitting diodes ("OLEDs") and printed electronics.

The following are non-limiting examples of compositions and methods for the disclosed metalized films.

EXAMPLES

In the tests described herein, an oriented polypropylene film was coated with an aluminum oxide coating. The film being tested was a 4-layer film having an A/B/C/D structure, wherein the core "C" layer was a polypropylene homopolymer, the "D" layer was a polyethylene skin layer, the adhesive layer "B" was Admer™ (Mitsui Chemical), which is a maleic-anhydride-modified polyolefin, on the opposing face, and an EVOH layer "A" was on the Admer™ layer. The EVOH is Eval™ G156B or G176B (Kuraray), both having 48 mole % ethylene content and melting point (ISO 11357, DSC) of 157° C. and 160° C., respectively, and both have a melt index (2.16 kg, 210° C.) of about 15 g/10 min. A fluoropolymer is present with the EvOH used in layer "A" via a masterbatch made by Ampacet and containing 99% Eval G176B+1% Kynar™ flex 2821. This base film had an optical density of 0.02 O.D, and a total thickness of about 18 μm.

In comparative films, films with an EVOH layer "A" using Soarnol™ grades from Nippon Gohsei were tested but failed. These Soarnal grades have ethylene contents of from 25 to 40 mol %, melt indices (2.16 kg, 210° C.) of from 3-12 g/10 min, and melting point in the range from 170-195° C.

The metallizer in the experiments is manufactured by General Vacuum Equipment Ltd. (Bobst Group) and performs the metal-oxidation of the film in one step as a batch under vacuum, where the film is unwound, plasma-treated, metal-oxidized, then plasma-treated a second time before the coated film is wound in a metalizing chamber under vacuum, wherein the optical density of the film is measured before and after metal-oxidation. The optical density target was 0.5, which in the system was equivalent to an aluminum wire feed speed of 26 cm/min and 1.6 mm wire diameter. Aluminum oxide is generated by injecting oxygen into the chamber where aluminum is heated to about 1400 to 1500° C. to evaporate the metal (i.e., its evaporation zone), and thereby creating reactive aluminum-oxide deposition.

The control loop of the metallizer is based on the reading of the optical density by optical sensor and controlling the oxygen flow. The set point was 0.13 O.D. Pre-plasma (i.e., plasma before metal-oxidized coating) was set at 6 kW power and using $5 \times 10^{-4}$ m$^3$/min. flow rate of 80% N$_2$+20% O$_2$ gas mixture. The process drum temperature is −15° C. The evaporation zone pressure is at $1.3 \times 10^{-3}$ mbar when O$_2$ flow is on. Before starting the evaporation process with O$_2$ flow off, the pressure value is $5.1 \times 10^{-4}$ mbar. The winding zone pressure is at $2.0$-$2.9 \times 10^{-2}$ mbar when O$_2$ flow is on. The line speed of the moving film being unwound, then wound, is 420 m/min. A gas wedge of 2 liter/min is used. A gas wedge is an air flow between the film and the process drum helping in improving heat exchange and in preventing wrinkles and creases over the process drum. The film is unwound with a tension 60-80 N/m and rewound with a tension 50 N/m. The post-plasma treatment is set at 6 kW power. The film is run such that the "A" layer is coated or metal-oxidized, thus forming an MO/A/B/C/D structured film, wherein "MO" is a metal oxide layer. The aluminum-oxide-coated film had an optical density of 0.03 O.D. and a total thickness of about 18 μm.

The results of oxygen transmission rate (OTR) and water-vapor transmission rate (WVTR) measurements (ASTM F1249) for a BOPP film coated with aluminum oxide, and having various combinations of pre- and post-plasma treatment, are presented in FIGS. 6 and 7. The metal-oxide side of the film was facing the water in the WVTR measurements. In FIGS. 6 and 7, different rolls of films were tested, that being indicated in parenthesis in the far left column. In the Figures, "slit" means that the rolls have been slit, i.e., cut, and then tested for OTR and WVTR.

The strength the aluminum oxide coatings of the invention and their ability to maintain impermeability was tested by adhering or laminating to a substrate and performing flexure tests. The WVTR conditions were 38° C./90% RH and OTR conditions were 23° C./0% RH. 18 μm EVOH-skin of aluminum-oxide-coated films with pre- and post-plasma were extrusion-laminated with Bicor™ 18LPX-2 (a biaxially oriented polypropylene film) using LDPE (Extrusion); and an 18 μm EVOH skin of aluminum oxide coated with pre- and post-plasma were adhesive-laminated with 18LPX-2 using polyurethane, i.e., adhesive. The films were tested by extending 2% and 8%, then measuring the OTR and WVTR. The Gelbo flex test is a special test where the sample, i.e., the laminated film, is held by the two edges and twisted several times. The Gelbo test (ASTM F392D) is performed using a GFT 392 instrument for 10 or 20 cycles, as indicated. The oxygen and water-vapor permeability is then tested, the results of which are in the FIGS. 8 and 9. Three measurements in different locations on the film were performed and recorded.

The Gelbo flex (ASTM F392 D) tests were performed at 2, 10 and 20 cycles. The instrument was a Gelbo flex fester, B&B Motor & Control Corp. No. 92142. Hayssen tests were performed using a Hayssen Ultima II—VFF & S Model 95-16-HR. Flexed WVTR and OTR property comparisons against Hayssen formed packages indicate the Hayssen data is comparable to the Gelbo flex condition, certainly for WVTR and to some degree for the OTR values. In the Hayssen test, the film enters a forming collar that is used to create the tube for vertical packaging. The Hayssen test is aimed at emulating the barrier degradation that the film endures after being moved through the forming collar by pulling it in the vertical form fin (or lap) seal ("VFFS") packaging machine.

Analysis of variance ("ANOVA") statistical analysis revealed no significant trend for WVTR at 38° C./90% RH. For OTR (23° C.), however, trends did materialize. For instance, at 0% RH (34 data points), post-plasma treatment only had a negative impact. At 70% RH (12 data points), Ar pre-plasma followed by post-plasma treatments had a positive impact. At 80% RH, Ar pre-plasma followed by post-plasma treatments had a positive impact. At 90% RH (6 data points), Ar pre-plasma followed by post-plasma treatments had a positive impact. And for 50% RH (10 data points), post-plasma treatment only has a positive impact.

FIGS. 10 and 11 depict example embodiments of the impact of the different AlO$_x$ deposition process parameters on the barrier performances for 18 μm coextruded-EVOH and 21 μm coated-PVOH base films respectively, wherein the base film is BOPP, but in other embodiments may be BOPE, BOPET or other polyolefins in other example embodiments. These process parameters include pre-plasma (nature/quantity of gas(s)/power), aluminum evaporation zone plasma (nature/quantity of gas(s)/power) and potentially post-plasma (nature/quantity of gas(s)/power). There is no over-coating process at this stage. The coated-PVOH BOPP base film provides a better barrier performance than did coextruded EVOH BOPP base film.

Regarding FIG. 12, coated-EVOH and coated-PVOH base films with $AlO_x$ appear the most robust as compared to folding and 2% elongation mechanical constraints.

Regarding FIGS. 13 (draw-down coatings) and 15 (coatings with flexography), over-coating of an $AlO_x$ film with PVOH, specifically, encapsulation, i.e., PVOH over coating on a PVOH-coated BOPP substrate, provided results that included a water-vapor transmission rate ("WVTR") of 1.2 to 1.6 g/m$^2$/day at 38° C. and 90% relative humidity ("RH"). The WVTR was 1.5 g/m$^2$/day after folding and 1.8 to 2.8 g/m$^2$/day after 2% elongation. With regard to Oxygen Transmission Rate ("OTR"), the PVOH over-coating example of FIG. 8 had an OTR of less than 0.07 cm$^3$/m$^2$/day at 23° C. and 0% RH. As for OTR after elongation or folding, the OTR is always less than 0.07 cm$^3$/m$^2$/day for PVOH over-coated substrates. A significant benefit of $AlO_x$ over-coating is the protection of barrier performances after 2% elongation. Acrylic coating appears to have a positive impact on the oxygen barrier.

Regarding FIG. 14, PVOH over-coating on coextruded-EVOH $AlO_x$ is a very efficient material to keep the barriers after folding and 2% elongation as compared to coextruded-EVOH and styrene-acrylic coatings. In all the cases, OTR @ 23° C./0% RH is ≤0.12 cc/m$^2$/day.

Regarding FIGS. 16 (Barriers) and 17 (Barriers after Mechanical Elongation such as Folding and 2% Elongation), adhesive lamination does not damage barrier performances, and, in most of the cases, the barrier is improved as compared to $AlO_x$ mono webs. Laminates with PVOH provide the improved results in terms of barrier compared to 12 μm PET and coextruded-EVOH laminates. With coated-PVOH $AlO_x$, WVTR @38° C./90% RH is ≤1.25 g/m$^2$/day when elongation is up to 1.5% and OTR @23° C./0% RH is ≤0.14 cc/m$^2$/day for 2% elongation;

Regarding FIG. 18, bond strength with $AlO_x$ with adhesive lamination are up to 370 g/inch with 12 PET and 265 g/inch for BOPP.

Regarding FIG. 19, barriers with $AlO_x$ with extrusion lamination are from 2.1 to 2.7 g/m$^2$/day for WVTR @38° C./90% RH and 0.1 to 0.35 cc/m$^2$/day for OTR @23° C./0% RH with $AlO_x$ laminates having coated-PVOH and coated-EVOH.

Regarding FIG. 20, an UV-barrier coating may provide relevant UV-barrier performances when using clear $AlO_x$ films.

INDUSTRIAL APPLICABILITY

The disclosed multilayered films may be are as stand-alone films, laminates, or webs. Or, the multilayered films may be sealed, coated, metallized, and/or laminated to other film structures, such as discussed herein. The disclosed multilayered films may be prepared by any suitable methods comprising the steps of co-extruding a multilayered film according to the description and claims of this specification, orienting and preparing the film for intended use such as by coating, printing, slitting, or other converting methods.

For some applications and as previously discussed, it may be desirable to laminate the multilayered films to other polymeric film or paper products for purposes such as package decor including printing and metallizing. These activities are typically performed by the ultimate end-users or film converters who process films for supply to the ultimate end-users.

The prepared multilayered film may be used as a flexible packaging film to package an article or good, such as a food item or other product. In some applications, the film may be formed into a pouch type of package, such as may be useful for packaging a beverage, liquid, granular, or dry-powder product.

In view of the foregoing, various bags, packages, pouches (e.g., stand-up, vertical fill-and-seal, horizontal fill-and-seal, etc.), films, laminates, and other structures may be formed from the above-described films, wherein such may have products (e.g., food, beverages) of any phase that require seals having requisite integrity and/or barriers to water and/or oxygen transmission with low thickness.

Below are illustrative embodiments of the disclosed invention in claim format:

1. A film comprising:
    a base film;
    a coating layer on the base film, wherein the coating layer has a surface energy of at least 30 dynes/cm and consists essentially of nylon, polyester, ethylene vinyl alcohol-based copolymer, polyvinyl alcohol-based polyethylene terephthalate, polyvinylchloride, acrylate-based polymers, methacrylate-based polymers, polyurethane, polyalkylimine, acid-modified polyolefins, polyetherester-amide block copolymer, and combinations thereof (but in some embodiments, the coating layer may be more restrictive, and to that end, for example, may consists essentially of one or more ethylene vinyl alcohol-based polymers, polyvinyl-based polymers and combinations thereof); and
    a metal oxide layer on the coating layer, wherein the metal oxide layer has an optical density of equal to or less than 0.5 and a thickness from 0.1 nm through 100 nm,
    wherein the film has an oxygen transmission rate of less than 4 cm$^3$/m$^2$/day at 23° C. and 0% relative humidity, a water vapor transmission rate of less than 4 g/m$^2$/day at 38° C. and 90% relative humidity, and a thickness of 5 μm through 50 μm.

2. The film of claim 1, further comprising one or more overcoatings on the metal oxide layer.

3. The film of claim 2, wherein at least one of the one or more overcoatings is functionalized.

4. The film of claim 3, wherein the at least one is a sealable coating comprising a polyolefin dispersion with at least 25 wt. % solids.

5. The film of claim 3, wherein the at least one is a sealable coating comprising a seal strength of at least 400 g/25 mm at 150° C.

6. The film of claim 3, wherein the at least one is a sealable coating comprising acrylic-based polymers, polyurethane-based polymers, polyvinylidene-chloride-based polymers, polyethylene terephthalate-based polymers, co-polyesters, or combinations thereof.

7. The film of claim 3, wherein the at least one is a sealable coating comprising a dynamic coefficient of friction of less than 0.5 against itself and less than 0.2 against metal.

8. The film of claim 3, wherein the oxygen transmission rate is less than 0.12 cm$^3$/m$^2$/day at 23° C. and 0% relative humidity and the water vapor transmission rate is less than 2 g/m$^2$/day at 38° C. and 90% relative humidity.

9. The film of claim 2, wherein the one or more overcoatings comprises ionomers, elastomers, plastomers, ethylene-vinyl-acetate-based polymers, vinyl-alcohol-based polymers, neutralized or not neutralized ethylene acrylic acidic polymers, polypropylene-based polymers, polyethylene-based polymers, organic acids such as maleic-acid-based, styrene-block copolymers, amorphous amide polymers, EVOH-based and/or PVOH-based polymer(s), ORMOCERs, or combinations thereof.

10. The film of claim 1, wherein the metal oxide layer on the coating layer is by plasma-assisted deposition of metal oxide onto the coating layer.

11. The film of claim 1, wherein the coating oxide layer and/or one or both outer layers of the base film are treated.

12. The film of claim 1, wherein a primer layer is on one or more selected from a group consisting of the base film, the coating layer, and the metal oxide layer.

13. The film of claim 1, wherein the film is adhesion-laminated to a substrate at either the metal oxide layer or an overcoating layer applied to the metal oxide layer, wherein a resulting adhesive-laminated film also has the oxygen transmission rate of less than 4 $cm^3/m^2$/day at 23° C. and 0% relative humidity and the water vapor transmission rate of less than 4 $g/m^2$/day at 38° C.

14. The film of claim 1, wherein the film comprises one or more additives in any one or more layers of the film.

15. The film of claim 1, wherein the metal oxide layer comprises a Group III or Group IV metal oxide or combination thereof.

16. The film of claim 1, wherein the optical density is less than 0.15.

17. The film of claim 1 by a method comprising:
coating a base film with a coating layer consisting essentially of nylon, polyester, ethylene vinyl alcohol-based copolymer, polyvinyl alcohol-based polyethylene terephthalate, polyvinylchloride, acrylate-based polymers, methacrylate-based polymers, polyurethane, polyalkylimine, acid-modified polyolefins, polyetherester-amide block copolymer, and combinations thereof (but in some embodiments, the coating layer may be more restrictive, and to that end, for example, may consists essentially of one or more ethylene vinyl alcohol-based polymers, polyvinyl-based polymers and combinations thereof); and
depositing a metal oxide layer on the coated base film, wherein the metal oxide layer has an optical density of less than 0.5 and a thickness from 0.1 nm through 100 nm,
wherein the film has an oxygen transmission rate of less than 4 $cm^3/m^2$/day at 23° C. and 0% relative humidity, a water vapor transmission rate of less than 4 $g/m^2$/day at 38° C. and 90% relative humidity, and a thickness of 5 μm through 50 μm.

18. The method of claim 17, further comprising treating the base film, the metal oxide layer, or both.

19. The method of claim 17, further comprising overcoating the metal oxide layer.

20. The method of claim 17, wherein the depositing is plasma-assisted depositing.

While the foregoing is directed to example embodiments of the disclosed invention, other and further embodiments may be devised without departing from the basic scope thereof, wherein the scope of the disclosed apparatuses, systems and methods are determined by one or more claims.

What is claimed is:
1. A film comprising:
a base film;
a polymer layer, coextruded with the base film or applied as a coating layer to the base film, consisting essentially of EVOH-based polymer, PVOH-based polymer, or blends thereof;
a metal oxide layer on the polymer layer, wherein the metal oxide layer has an optical density of equal to or less than 0.5 and a thickness from 0.1 nm through 100 nm; and
one or more overcoatings on the metal oxide layer, wherein at least one of the one or more overcoatings is functionalized, wherein at least one of the one or more overcoating is comprising a seal strength of at least 400 g/25 mm at 150° C.,
wherein the film has an oxygen transmission rate of less than 2.5 $cm^3/m^2$/day at 23° C. and 0% relative humidity, a water vapor transmission rate of less than 2.5 $g/m^2$/day at 38° C. and 90% relative humidity, and a thickness of 5 μm through 50 μm.

2. The film of claim 1, wherein the one or more overcoatings comprises a polyolefin dispersion with at least 25 wt. % solids.

3. The film of claim 1, wherein the one or more overcoatings comprises acrylic-based polymers, polyurethane-based polymers, polyvinylidene-chloride-based polymers, polyethylene terephthalate-based polymers, co-polyesters, or combinations thereof.

4. The film of claim 1, wherein the one or more overcoatings comprises a dynamic coefficient of friction of less than 0.5 against itself and less than 0.2 against metal.

5. The film of claim 1, wherein the oxygen transmission rate is less than 2 $cm^3/m^2$/day at 23° C. and 0% relative humidity.

6. The film of claim 1, wherein the one or more overcoatings comprises ionomers, elastomers, plastomers, ethylene-vinyl-acetate-based polymers, vinyl-alcohol-based polymers, neutralized or not neutralized ethylene acrylic acidic polymers, polypropylene-based polymers, polyethylene-based polymers, organic acids, maleic-acid-based, styrene-block copolymers, amorphous amide polymers, EVOH-based and/or PVOH-based polymer(s), ORMOCERs, or combinations thereof.

7. The film of claim 1, wherein the metal oxide layer on the polymer layer is by plasma-assisted deposition of metal oxide onto the coating layer.

8. The film of claim 1, wherein the base film, the polymer layer, and/or the metal oxide layer are treated.

9. The film of claim 1, wherein a primer layer is on one or more selected from a group consisting of the base film, the polymer layer, and the metal oxide layer.

10. The film of claim 1, wherein the film is adhesion-laminated to a substrate at the one or more overcoating layers applied to the metal oxide layer.

11. The film of claim 1, wherein the film comprises one or more additives in any one or more layers of the film.

12. The film of claim 1, wherein the metal oxide layer comprises a Group III or Group IV metal oxide or combination thereof.

13. The film of claim 1, wherein the optical density is less than 0.15.

14. The film of claim 1 formed by a method comprising:
coextruding or coating a polymer layer with the base film, wherein the polymer layer consists essentially of EVOH-based polymer, PVOH-based polymer, or blends thereof to produce a coextruded or coated base film;
depositing a metal oxide layer on the coextruded or coated base film, wherein the metal oxide layer has an optical density of less than 0.5 and a thickness from 0.1 nm through 100 nm; and
overcoating one or more overcoatings on the metal oxide layer, wherein at least one of the one or more overcoatings is functionalized, wherein at least one of the one or more overcoating is comprising a seal strength of at least 400 g/25 mm at 150° C., wherein the film has an oxygen transmission rate of less than 2.5 $cm^3/m^2$/day at 23° C. and 0% relative humidity, a water vapor transmission rate of less than 2.5 $g/m^2$/day at 38° C. and 90% relative humidity, and a thickness of 5 μm through 50 μm.

15. The method of claim 14, further comprising treating the base film, the metal oxide layer, or both.

16. The method of claim 14, wherein the depositing is plasma-assisted depositing.

* * * * *